(12) United States Patent
Yamazaki et al.

(10) Patent No.: US 7,820,231 B2
(45) Date of Patent: Oct. 26, 2010

(54) MANUFACTURING APPARATUS

(75) Inventors: Shunpei Yamazaki, Tokyo (JP); Masakazu Murakami, Kanagawa (JP)

(73) Assignee: Semiconductor Energy Laboratory Co., Ltd., Kanagawa-Ken (JP)

( * ) Notice: Subject to any disclaimer, the term of this patent is extended or adjusted under 35 U.S.C. 154(b) by 0 days.

(21) Appl. No.: 11/711,656

(22) Filed: Feb. 28, 2007

(65) Prior Publication Data
US 2007/0148351 A1 Jun. 28, 2007

Related U.S. Application Data

(62) Division of application No. 10/617,765, filed on Jul. 14, 2003, now abandoned.

(30) Foreign Application Priority Data
Aug. 1, 2002 (JP) ............... 2002-224760

(51) Int. Cl.
*B05D 5/06* (2006.01)
*C23C 16/00* (2006.01)

(52) U.S. Cl. .............. 427/69; 427/66; 427/255.23; 118/727

(58) Field of Classification Search ........... 427/66, 427/69, 70, 255.23; 118/726, 727
See application file for complete search history.

(56) References Cited

U.S. PATENT DOCUMENTS

| | | |
|---|---|---|
| 2,435,997 A | 2/1948 | Bennett |
| 2,436,997 A | 2/1948 | Bennett |
| 3,931,490 A | 1/1976 | Grothe et al. |
| 4,023,523 A | 5/1977 | Ing |
| 4,187,801 A | 2/1980 | Monk |
| 4,627,989 A | 12/1986 | Feuerstein et al. |
| 4,897,290 A | 1/1990 | Terasaka et al. |
| 5,258,325 A | 11/1993 | Spitzer et al. |
| 5,259,881 A | 11/1993 | Edwards et al. |

(Continued)

FOREIGN PATENT DOCUMENTS

EP 0 998 170 A2 5/2000

(Continued)

OTHER PUBLICATIONS

McCabe et al., *Unit Operations of Chemical Engineering*, McGraw-Hill Book Co., 1967, pp. 388-396.

(Continued)

*Primary Examiner*—Timothy H Meeks
*Assistant Examiner*—James Lin
(74) *Attorney, Agent, or Firm*—Nixon Peabody LLP; Jeffrey L. Costellia

(57) ABSTRACT

The present invention provides an evaporation apparatus, which is one type of film formation apparatus and provides superior uniformity in EL layer film thickness, superior throughput, and improved utilization efficiency of EL materials and an evaporation method. The present invention is characterized in that an evaporation source holder, in which a container that encloses an evaporation material is disposed, is moved at a certain pitch with respect to a substrate during evaporation. Further, a film thickness monitor is integrated with the evaporation source holder for the movement. Furthermore, film thickness can be made uniform by adjusting the moving speed of the evaporation source holder in accordance with values measured by the film thickness monitor.

32 Claims, 13 Drawing Sheets

U.S. PATENT DOCUMENTS

| | | | |
|---|---|---|---|
| 5,429,884 | A | 7/1995 | Namiki et al. |
| 5,512,320 | A | 4/1996 | Turner et al. |
| 5,703,436 | A | 12/1997 | Forrest et al. |
| 5,817,366 | A | 10/1998 | Arai et al. |
| 5,850,071 | A | 12/1998 | Makiguchi et al. |
| 5,906,857 | A | 5/1999 | McKee et al. |
| 5,943,471 | A * | 8/1999 | Atwell ............ 392/386 |
| 6,011,904 | A | 1/2000 | Mattord |
| 6,132,280 | A | 10/2000 | Tanabe et al. |
| 6,132,805 | A | 10/2000 | Moslehi |
| 6,179,923 | B1 | 1/2001 | Yamamoto et al. |
| 6,237,529 | B1 | 5/2001 | Spahn |
| 6,244,212 | B1 | 6/2001 | Takacs et al. |
| 6,326,726 | B1 | 12/2001 | Mizutani et al. |
| 6,403,392 | B1 | 6/2002 | Burrows et al. |
| 6,410,168 | B1 * | 6/2002 | Tamura ............ 428/690 |
| 6,482,752 | B1 | 11/2002 | Yamazaki et al. |
| 6,503,778 | B1 | 1/2003 | Yamauchi et al. |
| 6,558,219 | B1 | 5/2003 | Burroughes et al. |
| 6,633,121 | B2 | 10/2003 | Eida et al. |
| 6,641,674 | B2 | 11/2003 | Peng |
| 6,649,210 | B2 | 11/2003 | Tokailin et al. |
| 6,656,273 | B1 | 12/2003 | Toshima et al. |
| 6,770,562 | B2 | 8/2004 | Yamazaki et al. |
| 6,776,880 | B1 | 8/2004 | Yamazaki |
| 6,786,789 | B2 | 9/2004 | Sakai et al. |
| 6,830,626 | B1 | 12/2004 | Smith |
| 6,952,078 | B1 | 10/2005 | Guenther |
| 7,210,979 | B2 | 5/2007 | Sakai et al. |
| 7,462,372 | B2 | 12/2008 | Konuma et al. |
| 7,482,631 | B2 | 1/2009 | Yamazaki et al. |
| 2001/0005021 | A1 * | 6/2001 | Fukuyama et al. ........ 257/103 |
| 2001/0006827 | A1 | 7/2001 | Yamazaki et al. |
| 2001/0009154 | A1 | 7/2001 | Nguyen et al. |
| 2001/0050532 | A1 | 12/2001 | Eida et al. |
| 2002/0009538 | A1 | 1/2002 | Arai |
| 2002/0011205 | A1 | 1/2002 | Yamazaki et al. |
| 2002/0020494 | A1 | 2/2002 | Yokogawa et al. |
| 2002/0076847 | A1 | 6/2002 | Yamada et al. |
| 2002/0179013 | A1 * | 12/2002 | Kido et al. ............ 118/718 |
| 2002/0187265 | A1 | 12/2002 | Mori et al. |
| 2002/0197418 | A1 | 12/2002 | Mizukami et al. |
| 2002/0197760 | A1 | 12/2002 | Yamazaki et al. |
| 2003/0101937 | A1 | 6/2003 | Van Slyke et al. |
| 2003/0162314 | A1 | 8/2003 | Yamazaki et al. |
| 2003/0194484 | A1 | 10/2003 | Yamazaki et al. |
| 2003/0221620 | A1 | 12/2003 | Yamazaki |
| 2004/0031442 | A1 | 2/2004 | Yamazaki et al. |
| 2004/0035360 | A1 | 2/2004 | Yamazaki et al. |
| 2007/0167103 | A1 | 7/2007 | Sakai et al. |
| 2008/0014822 | A1 | 1/2008 | Yamazaki et al. |
| 2009/0155941 | A1 | 6/2009 | Konuma et al. |

FOREIGN PATENT DOCUMENTS

| | | |
|---|---|---|
| EP | 1 071 117 | 1/2001 |
| EP | 1 199 909 A1 | 4/2002 |
| EP | 1 207 557 A2 | 5/2002 |
| JP | 61-284569 | 12/1986 |
| JP | 03-062515 | 3/1991 |
| JP | 06-065722 | 3/1994 |
| JP | 10-041069 | 2/1998 |
| JP | 10-124869 | 5/1998 |
| JP | 11-050232 | 2/1999 |
| JP | 11-229123 | 8/1999 |
| JP | 2000-133446 | 5/2000 |
| JP | 2001-081558 | 3/2001 |
| JP | 2001-093667 | 4/2001 |
| JP | 2001-247959 | 9/2001 |
| JP | 2002-060926 | 2/2002 |
| JP | 2002-158090 | 5/2002 |
| JP | 2002-206163 | 7/2002 |
| JP | 2002-367781 | 12/2002 |
| JP | 2002-002778 | 1/2003 |
| JP | 2003-002778 | 1/2003 |
| JP | 2003-034591 | 2/2003 |
| JP | 2004-35964 | 2/2004 |
| KR | 2002-0025760 | 4/2002 |
| TW | 439144 | 6/2001 |
| TW | 468204 B | 12/2001 |
| TW | 492067 B | 6/2002 |
| WO | WO 01/44865 A1 | 6/2001 |
| WO | WO 01/72091 A1 | 9/2001 |

OTHER PUBLICATIONS

Taiwan Office Action (Application No. 92119575; TW6526), dated Sep. 19, 2008) with full English translation.

McCabe et al., Unit Operations of Chemical Engineering, "Radiation Heat Transfer", McGraw-Hill Book Co., Second Edition (1967), pp. 388-396.

Office Action (Application No. 92119575; TW6526) dated Feb. 27, 2009.

Office Action (Application No. 2003-0050827; KR06526) Dated: Feb. 26, 2010 with English Translation.

* cited by examiner

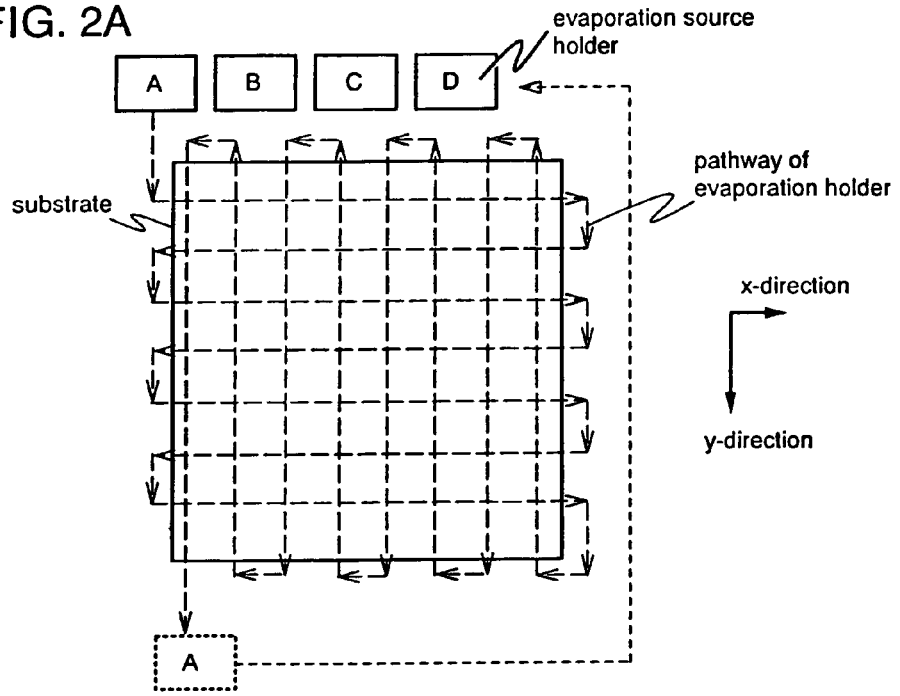
FIG. 2A
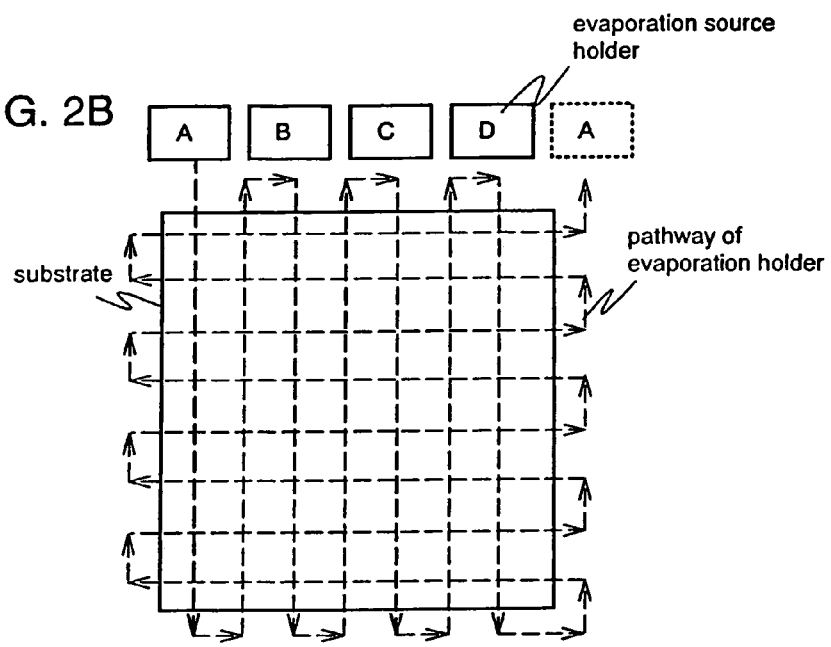
FIG. 2B
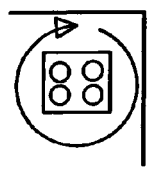
FIG. 2C movement of evaporation source holder at substrate circumferential portion
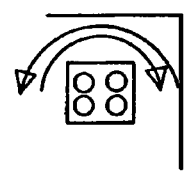
FIG. 2D movement of evaporation source holder at substrate circumferential portion FIG. 4A top view
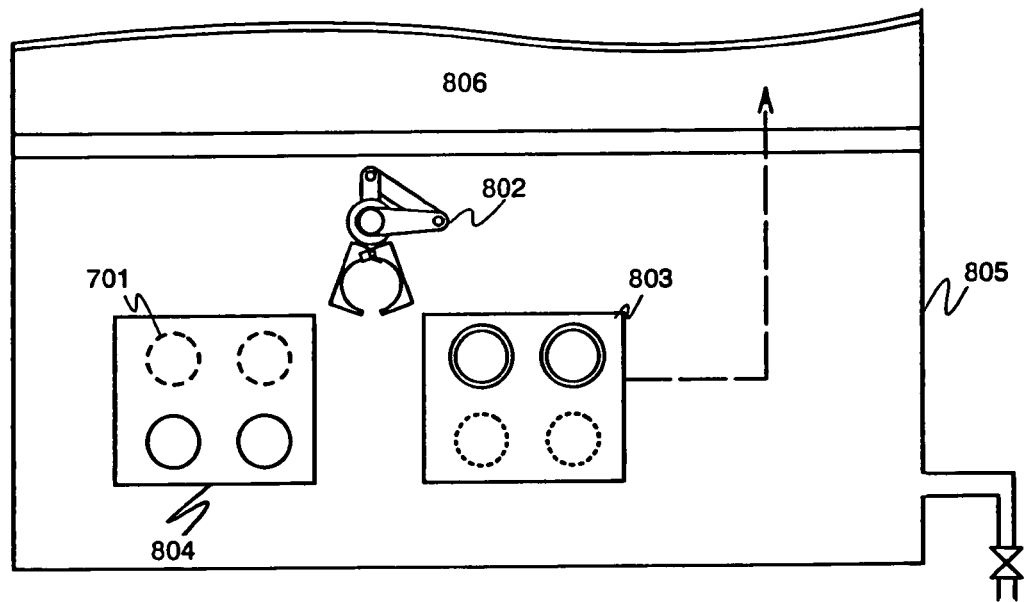
FIG. 4B perspective view
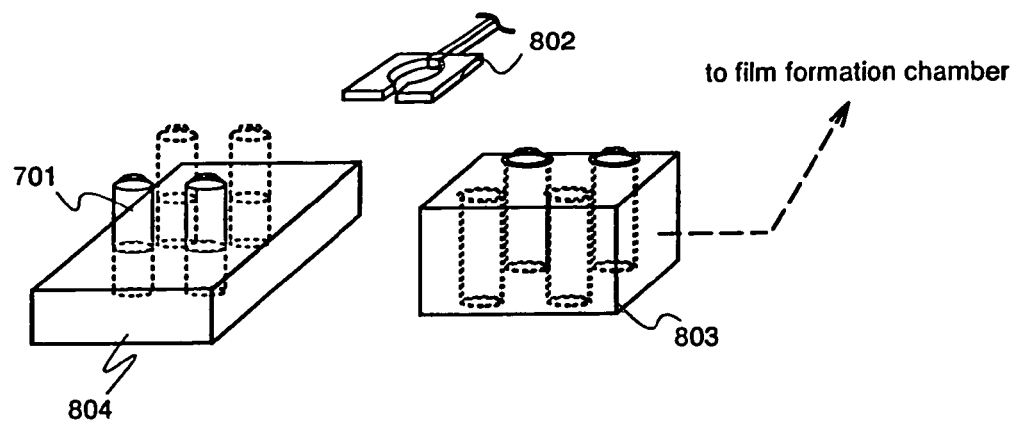

FIG. 5A top view
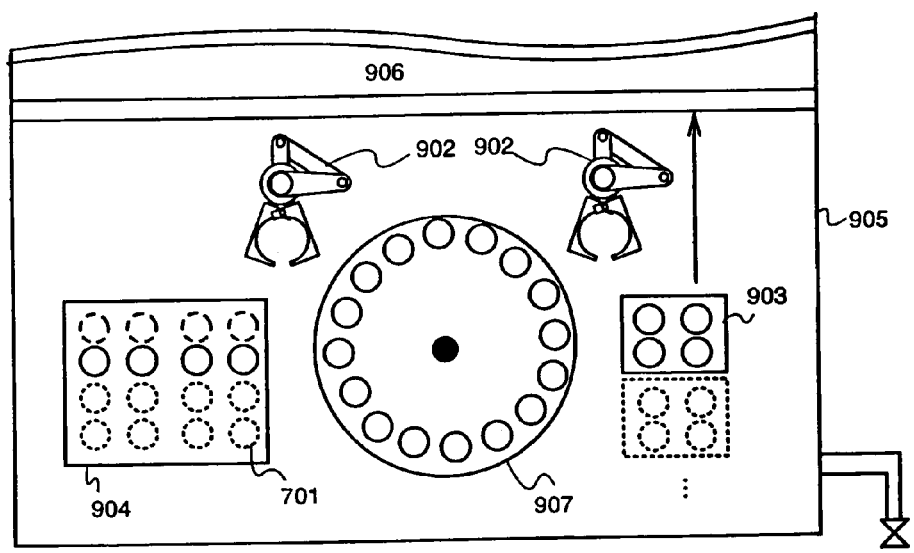
FIG. 5B perspective view
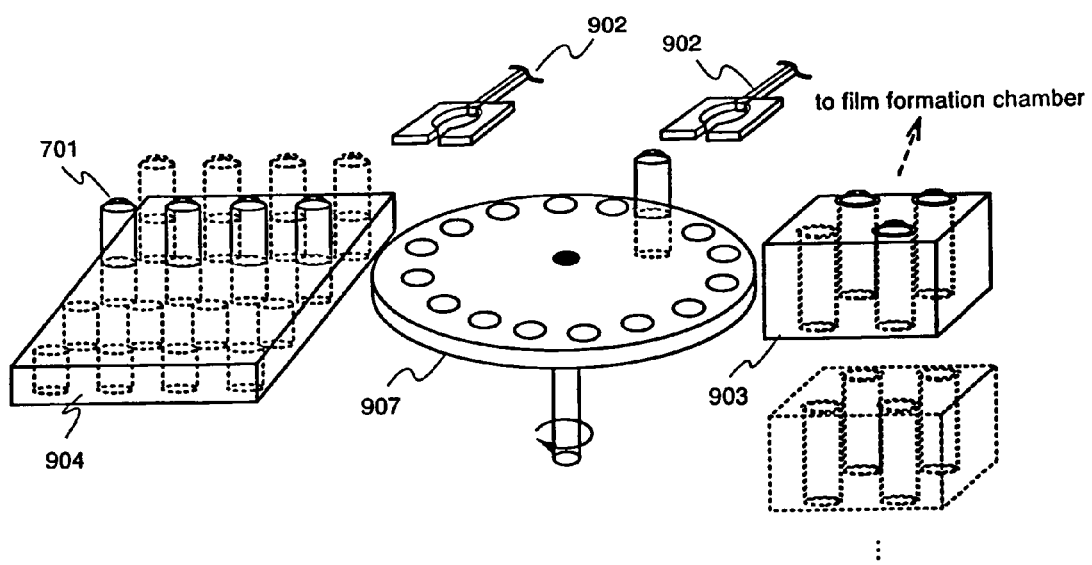

FIG. 7A shutter open
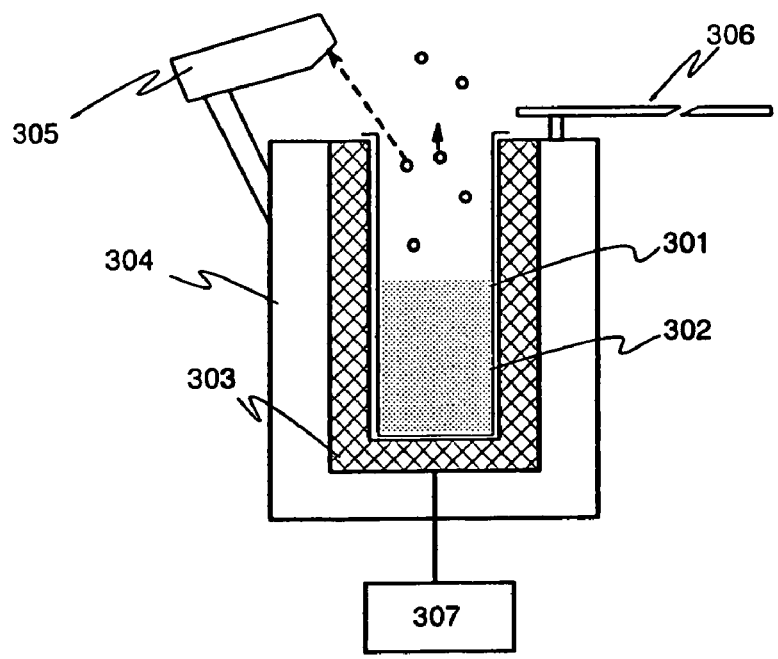
FIG. 7B shutter close
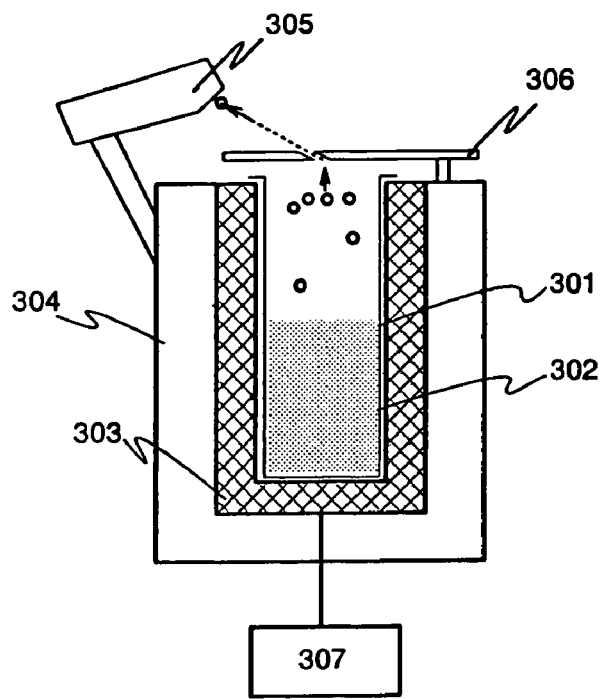

FIG. 8A shutter open
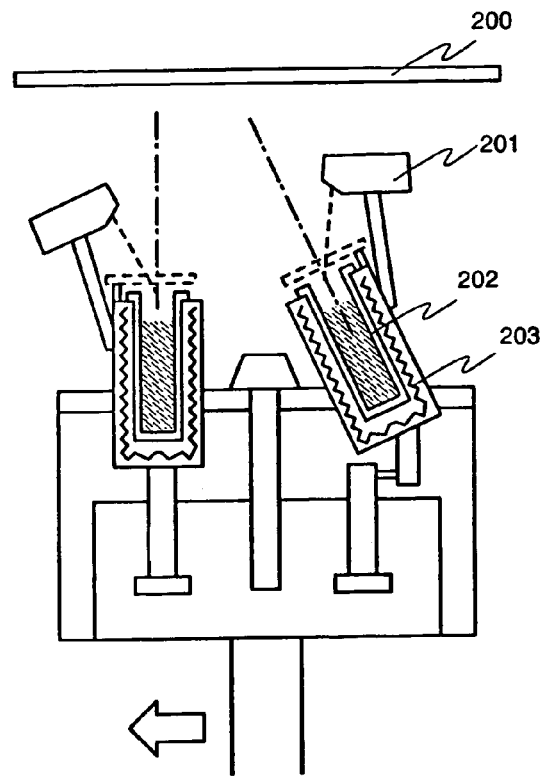
FIG. 8B shutter open
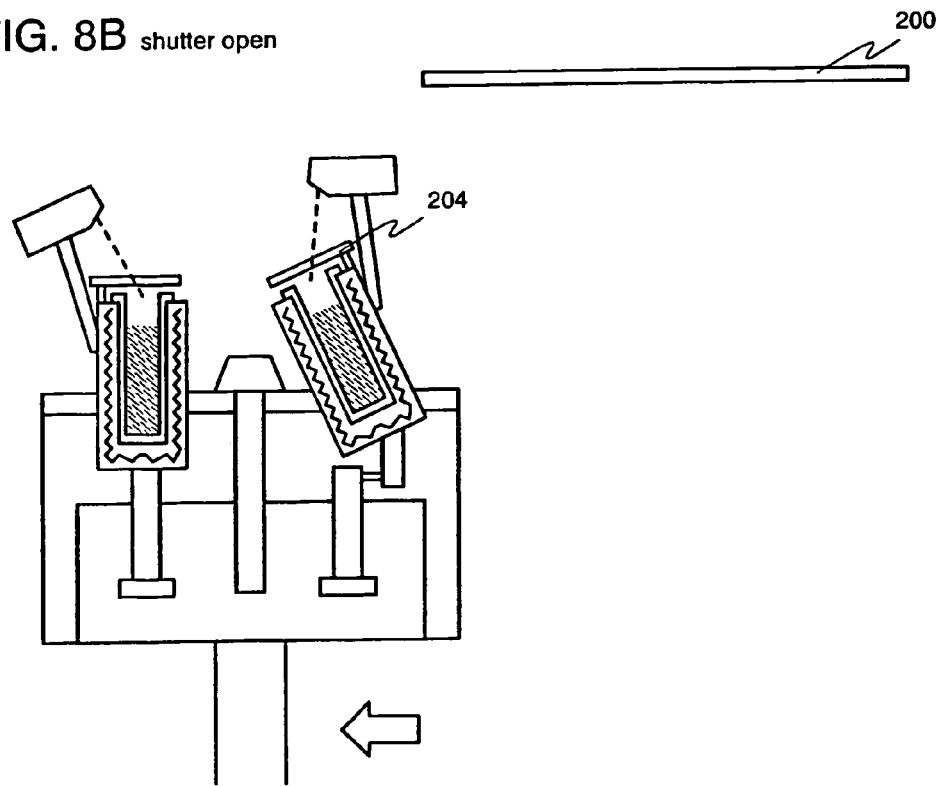

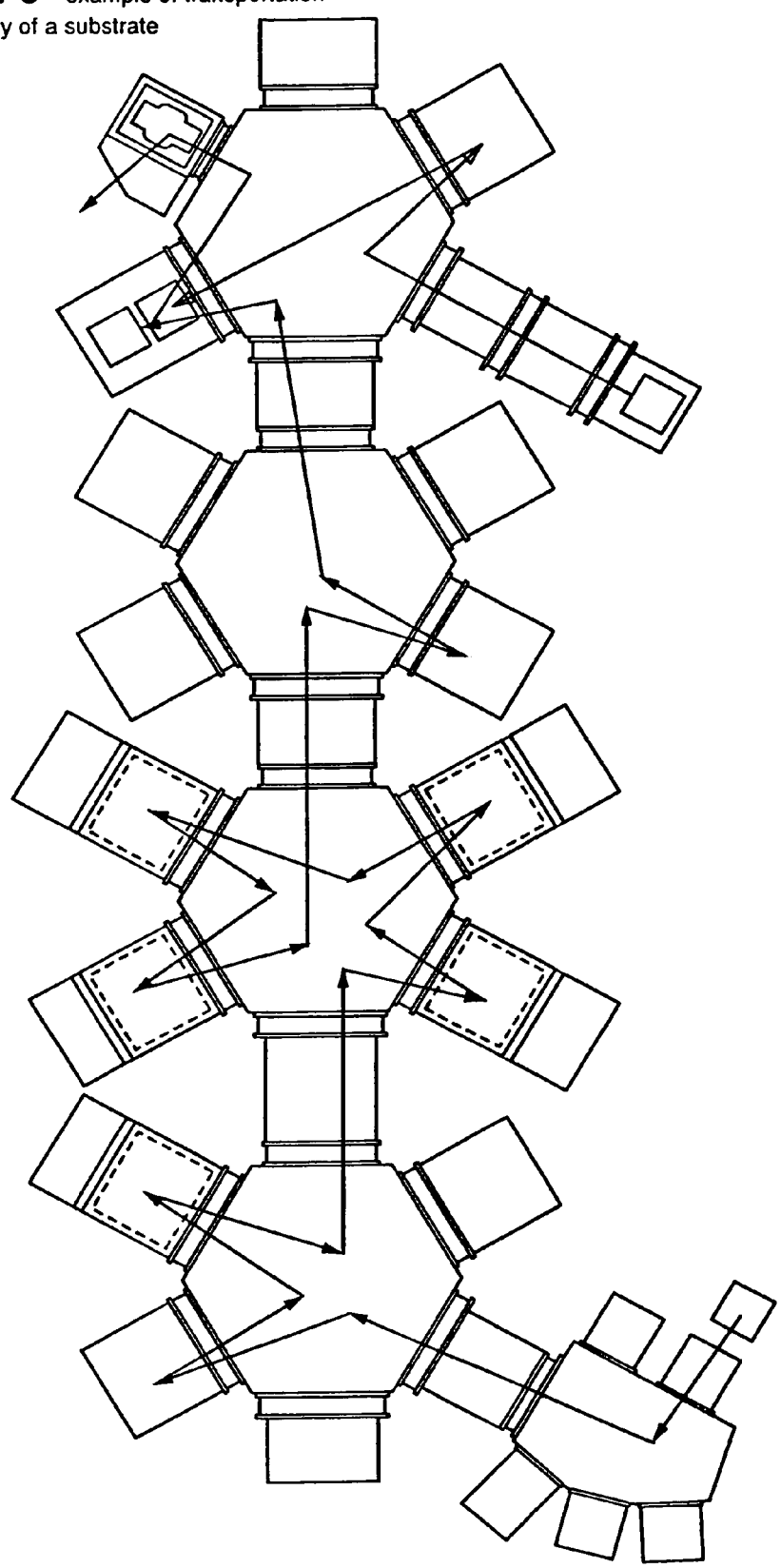
FIG. 9 example of transportation pathway of a substrate

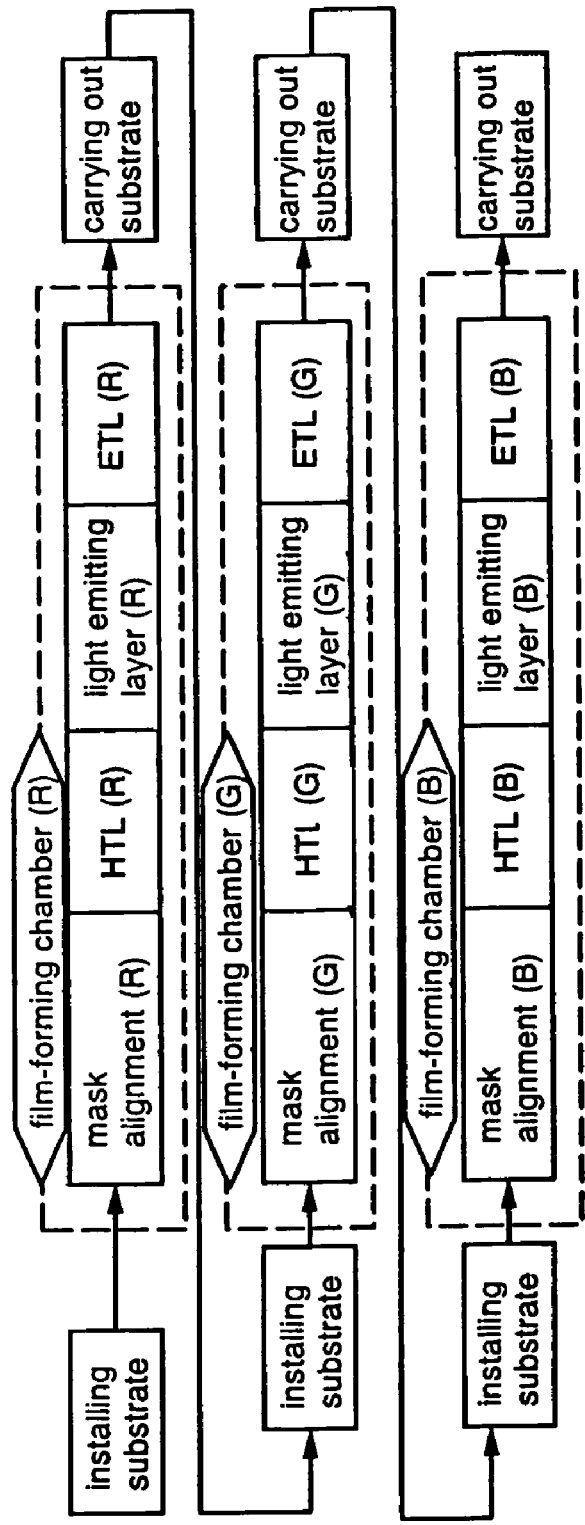
FIG. 11 case in which RGB light emitting element is formed by a plurality of chambers FIG. 12A case in which RGB light emitting element is formed by the same chamber
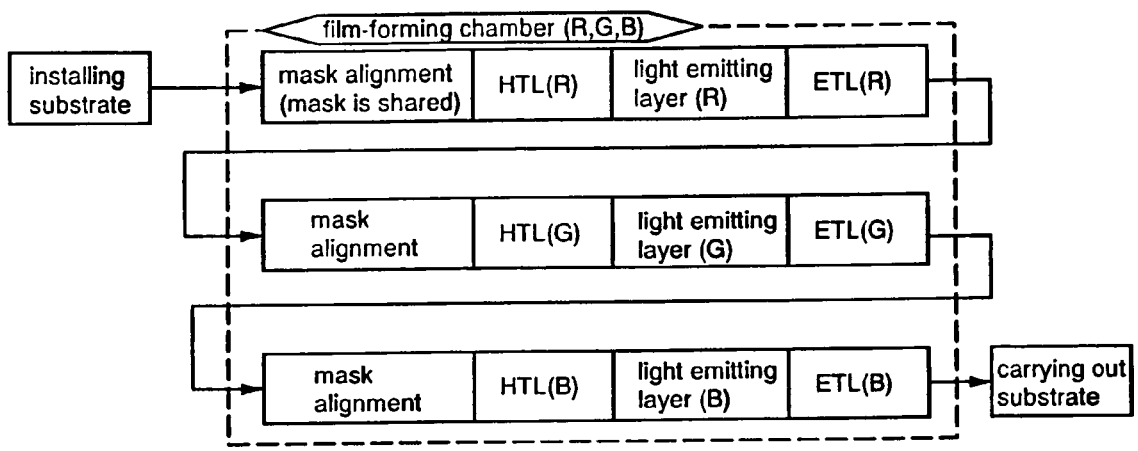
FIG. 12B
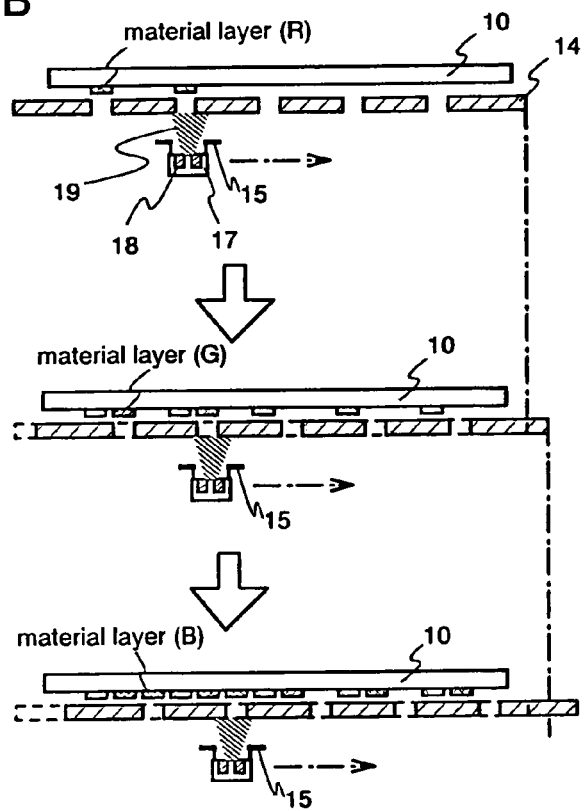

MANUFACTURING APPARATUS

This application is a Divisional of Ser. No. 10/617,765 Filed Jul. 14, 2003 now abandoned.

BACKGROUND OF THE INVENTION

1. Field of the Invention

The present invention relates to a manufacturing method provided with a deposition device for depositing materials which can be deposited by evaporation (hereinafter, an evaporation material), and a manufacturing method of a light emitting device that has a layer containing an organic compound as a light emitting layer with the manufacturing apparatus. Specifically, the present invention relates to a vacuum-evaporation method and an evaporation apparatus that conducts deposition by evaporating an evaporation material from a plurality of evaporation sources provided to face a substrate.

2. Description of the Related Arts

In recent years, a research related to a light emitting device having an EL element as a self-luminous light emitting element has been activated. The light emitting device is referred to as EL display or light emitting diode (LED). Since these light emitting devices have characteristics such as rapid speed of response that is suitable for movie display, low voltage, low power consumption driving, or the like, they attracts an attention for a next generation display including new generation's cellular phones and portable information terminals (PDA).

An EL element that has a layer containing an organic compound as a light emitting layer has a structure that an organic compound-containing layer (hereinafter, an EL layer) is sandwiched between an anode and a cathode. Electro luminescence is generated in the EL layer by applying an electronic field to the anode and the cathode. Luminescence obtained from the EL element includes light emission in returning to a base state from singlet excitation (fluorescence) and light emission in returning to a base state from triplet excitation (phosphorescence).

Above EL layer has a laminated structure typified by "a hole transporting layer, a light emitting layer, an electron transporting layer". An EL material for forming an EL layer is classified broadly into a low-molecular (monomer) material and high-molecular (polymer) material. The low-molecular material is deposited using the evaporation apparatus.

The evaporation apparatus has a substrate holder installed on a substrate, a melting pot encapsulated an EL material, an evaporation material, a shutter for prevention of rising an EL material that will be sublimed, and a heater for heating an EL material in a melting pot. Then, an EL material heated by the heater is sublimed and deposited on a rolling substrate. At this time, in order to deposit uniformly, the substrate and the melting pot is necessary to have a distance therebetween at least 1 m.

According to the above-described evaporation apparatus and the above-described vacuum evaporation method, when the EL layer is formed by vacuum evaporation, almost all of the sublimated EL material is adhered to an inner wall, a shutter or an adherence preventive shield (protective plate for preventing a vacuum evaporation material from adhering to an inner wall of a deposition chamber) at inside of the deposition chamber of the evaporation apparatus. Therefore, in forming the EL layer, an efficiency of utilizing the expensive EL material is as extremely low as about 1% or smaller and fabricating cost of a light emitting device becomes very expensive.

Further, according to the evaporation apparatus of the related art, in order to provide a uniform film, it is necessary to separate a substrate from an evaporation source by an interval equal to or larger than 1 m. Therefore, the evaporation apparatus per se becomes large-sized, a time period required for emptying gas from each deposition chamber of the evaporation apparatus is prolonged and therefore, a deposition rate is retarded and throughput is lowered. Moreover, when the substrate becomes larger, there is the problem that the film thickness of the center part and the margin of the substrate easily become different. Further, the evaporation apparatus is of a structure of rotating the substrate and therefore, there is a limit in the evaporation apparatus aiming at a large area substrate.

Further, the EL material poses a problem of being deteriorated by being easily oxidized by presence of oxygen or water. However, in forming a film by an evaporation method, a predetermined amount of an evaporation material put into a vessel (glass bottle) is taken out and transferred to a vessel (representatively, crucible, or evaporation boat) installed at a position opposed to an object to be formed with a film at inside of an evaporation apparatus stem and there is a concern that the evaporation material is mixed with oxygen or water or an impurity in the transferring operation.

Further, when the evaporation material is transferred from the glass bottle to the vessel, the evaporation material is transferred by the human hand at inside of a pretreatment chamber of a deposition chamber provided with a glove or the like. However, when the glove is provided at the pretreatment chamber, vacuum cannot be constituted, the operation is carried out under atmospheric pressure and there is a high possibility of mixing an impurity. For example, even when the transferring operation is carried out at inside of the pretreatment chamber subjected under a nitrogen atmosphere, it is difficult to reduce moisture or oxygen as less as possible. Further, although it is conceivable to use a robot, since the evaporation material is in a powder-like shape, it is very difficult to fabricate the robot for carrying out the transferring operation. Therefore, it is difficult to constitute steps of forming an EL element, that is, from a step of forming an EL layer above a lower electrode to a step of forming an upper electrode by an integrated closed system enabling to avoid mixing of an impurity.

SUMMARY OF THE INVENTION

Hence, the present invention provides an evaporation apparatus which is a manufacturing device promoting an efficiency of utilizing an EL material and forming film excellent in uniformity or throughput of forming an EL layer and an evaporation method therefor. Further, the invention provides a light emitting device fabricated by the evaporation apparatus and the evaporation method according to the invention and a method of fabricating the light emitting device.

Further, the invention provides a manufacturing device of subjecting an EL material to evaporation efficiently to a large area substrate having a substrate size of, for example, 320 mm×400 mm, 370 mm×470 mm, 550 mm×650 mm, 600 mm×720 mm, 680 mm×880 mm, 1000 mm×1200 mm, 1100 mm×1250 mm or 1150 mm×1300 mm. The present invention also provides an evaporation apparatus that can obtain uniform film thickness for a large area substrate in its whole surface.

Further, the invention provides a fabricating device capable of avoiding an impurity from mixing to an EL material.

The present invention provides an evaporation apparatus having such a feature that a substrate and an evaporation source move relative to each other in order to attain the aforementioned objectives. That is, the present invention has a feature in that an evaporation source holder, on which a container 501 that encloses an evaporation material is disposed, moves at a pitch with respect to the substrate in the evaporation apparatus. Further, a film thickness monitor is integrated with the evaporation source holder to be moved. Further, the moving speed of the evaporation source holder is controlled in accordance with values measured by the film thickness monitor to obtain uniform film thickness.

Further, as shown by an example thereof in FIG. 3, evaporation speed can always be measured, even in a state in which a shutter 503 is closed, by opening a minute hole in the shutter 503, thus making an evaporation material emitted obliquely from the hole (opening portion S2) strike the film thickness monitor. Note that there are no limitations placed on the method used for opening and closing the shutter. A sliding shutter may also be used. The container 501 that encloses the evaporation material is heated and left in a heated state during evaporation. Even if there is no substrate above the evaporation source holder 502 after the movement thereof, heating is still performed. Therefore, by using the shutter 503, waste of the evaporation material can be eliminated. Further, the minute hole is formed in the shutter, so a leak can be formed in the container so that the pressure within the container may be prevented from becoming high pressure. Note that an opening surface area S2 of the hole is made smaller than an opening portion surface area S1 of the container.

Further, it is preferable that the evaporation source holder be rotated at a substrate circumferential portion in order to make the film thickness uniform. An example of the evaporation source holder rotating is shown in FIG. 2C. Further, half-rotation may also be repeatedly performed as shown in FIG. 2D. It is preferable to move the evaporation source holder at a certain pitch so that sublimated edges (hems) of the evaporation material are made to overlap.

Further, the main cause of shrinkage, whereby a non-light emitting region expands, is that a minute amount of moisture, which includes adsorbed moisture, reaches a layer that contains an organic compound. It is therefore desirable to remove the moisture (including adsorbed moisture) residing within an active matrix substrate provided with a TFT immediately before forming the layer that contains the organic compound on the active matrix substrate.

The present invention can prevent or reduce the development of shrinkage by providing a heat treatment chamber for uniformly heating a plurality of substrates, and performing vacuum heating at temperature of 100° C. to 250° C. before forming the organic compound containing layer using a plurality of plate heaters (typically, sheath heater). In particular, moisture is easily adsorbed by organic resin materials when such materials are used as an interlayer insulating film or partition material, and in addition, there is a fear in that degassing will develop. Therefore, it is effective to perform vacuum heating at the temperature of 100° C. to 250° C. before forming the organic compound containing layer.

In addition, according to the present invention, it is preferable that steps from forming the organic compound containing layer through sealing be performed without exposure to the ambient atmosphere in order to prevent moisture from penetrating to the organic compound containing layer.

According to an aspect of the invention disclosed in this specification, it is characterized in that a manufacturing apparatus includes:
a loading chamber;
a transporting chamber coupled to the loading chamber;
a plurality of film formation chambers coupled to the transporting chamber;
a processing chamber coupled to the transporting chamber;
wherein each of the plurality of film formation chambers is coupled to a vacuum evacuation processing chamber for making the inside of the film formation chamber vacuum;
wherein each of the plurality of film formation chambers includes:
alignment means for performing position alignment of a mask and a substrate;
substrate holding means;
an evaporation source holder; and
means for moving the evaporation source holder;
wherein the evaporation source holder includes:
a container that seals an evaporation material;
means for heating the container; and
a shutter formed over the container;
wherein the processing chamber is coupled to a vacuum evacuation processing chamber for providing a vacuum state;
wherein a plurality of plate heaters are disposed in the processing chamber so as to overlap and open gaps therebetween; and
wherein the processing chamber can perform vacuum heating on a plurality of substrates.

Further, it is preferable to perform plasma processing before evaporation of a layer that contains an organic compound in order to remove organic substances and moisture.

According to another aspect of the present invention, it is characterized in that a manufacturing apparatus includes:
a loading chamber;
a transporting chamber coupled to the loading chamber;
a plurality of film formation chambers coupled to the transporting chamber;
a processing chamber coupled to the transporting chamber;
wherein each of the plurality of film formation chambers is coupled to a vacuum evacuation processing chamber for making the inside of the film formation chamber vacuum;
wherein each of the plurality of film formation chambers includes:
alignment means for performing position alignment of a mask and a substrate;
substrate holding means;
an evaporation source holder; and
means for moving the evaporation source holder;
wherein the evaporation source holder includes:
a container that seals an evaporation material;
means for heating the container; and
a shutter formed over the container;
wherein the processing chamber is coupled to a vacuum evacuation processing chamber for providing a vacuum state; and
wherein hydrogen gas, oxygen gas, or an inert gas is introduced in the processing chamber to generate a plasma.

In the structure described above, the apparatus is characterized in that a plurality of plate heaters are disposed in the transporting chamber so as to overlap and open gaps therebetween and a processing chamber capable of performing vacuum heating on a plurality of substrates is coupled to the transporting chamber. Uniformly performing vacuum heating on the substrates and removing adsorbed moisture from the substrates using the plate heaters can prevent or reduce the development of shrinkage.

Further, the means for moving the evaporation source holder in each of the structures described above functions to move the evaporation source holder in an x-axis direction at a certain pitch, and functions to move the evaporation source holder in a y-axis direction at a certain pitch. Substrate rotation is not necessary in an evaporation method of the present invention, and therefore an evaporation apparatus capable of handling large surface area substrates can be provided. Further, it becomes possible to form evaporated films uniformly in accordance with the present invention, in which the evaporation source holder moves with respect to the substrates in the x-axis direction and in the y-axis direction.

In the evaporation apparatus of the present invention, a gap distance d between the substrates and the evaporation source holder during evaporation is shortened to, typically equal to or less than 30 cm, preferably equal to or less than 20 cm, more preferably from 5 cm to 15 cm. The utilization efficiency of the evaporation material as well as throughput is thus markedly improved.

The evaporation source holder in the evaporation apparatus described above includes: a container (typically a crucible); a heater provided on the outside of the container through a soaking member; a heat insulating layer formed on the outside of the heater; an outer casing in which the aforementioned elements are received; a cooling pipe wound around the outside of the outer casing; an evaporation shutter that opens and closes an opening portion of the outer casing including an opening portion of a crucible; and a film thickness sensor. Note that a container capable of being transported in a state with the heater fixed to the container may also be used. Further, the container is one capable of withstanding high temperature, high pressure, and low pressure, and is made by using a material such as sintered boron nitride (BN), a sintered compound of boron nitride (BN) and aluminum nitride (AlN), quartz, or graphite.

Further, a mechanism capable of moving the evaporation source holder within the film formation chamber in the x-direction and in the y-direction, with the evaporation source holder maintained in a horizontal attitude, is provided. The evaporation source holder is moved in a zigzag manner here, as shown in the planar plane of the evaporation source holder in FIG. 2A and FIG. 2B. Further, the movement pitch used for the evaporation source holder may be suitably adjusted to the partition spacing.

Note that the timing at which evaporation source holders A, B, C, and D begin to move may be after movement of the previous evaporation source holder has stopped, and may also be before movement of the previous evaporation source holder has stopped, in FIG. 2A and FIG. 2B. For example, if an organic material having hole transporting characteristics is set into the evaporation source holder A, an organic material that becomes a light emitting layer is set in the evaporation source holder B, an organic material having electron transporting characteristics is set in the evaporation source holder C, and a material that becomes a cathodic buffer is set in the evaporation source holder D, then layers of these materials can be laminated in succession in the same chamber. Further, regions in interfaces between each film, in which the evaporation materials are mixed (mixing region), can be formed in an EL layer having a laminate structure provided that movement of the next evaporation source holder begins before the current evaporated film has solidified.

In accordance with the present invention, in which the substrates and the evaporation source holders A, B, C, and D move relative to each other, it is not necessary to make the distance between the substrates and the evaporation source holders long, and apparatus miniaturization can thus be achieved. Further, the evaporation apparatus becomes small, and therefore the adhesion of sublimated evaporation materials on interior walls within the film formation chambers, or on evaporation preventing shields can be reduced. The evaporation materials can thus be utilized without waste. In addition, it is not necessary to rotate the substrates in the evaporation method of the present invention, and therefore an evaporation apparatus capable of handling large surface area substrates can be provided. Further, it becomes possible to form evaporated films uniformly in accordance with the present invention, in which the evaporation source holders are moved to the substrates in the x-direction and in the y-direction.

Further, it is not always necessary that one organic compound or one type of organic compound be provided in the evaporation source holders. A plurality of materials or types may also be used. For example, in addition to one type of material provided as a light emitting organic compound in an evaporation source holder, a different organic compound capable of serving as a dopant (dopant material) may also be provided. It is preferable that an organic compound layer for evaporation be structured by a host material, and by a light emitting material (dopant material) having a lower excitation energy than the host material. It is also preferable that the excitation energy of the dopant be lower than the excitation energy of a hole transporting region and lower than the excitation energy of an electron transporting layer. The dopant can thus be made to effectively emit light while diffusion of the molecular excitons of the dopant is prevented. Further, the carrier recombination efficiency can also be increased, provided that the dopant is a carrier trapping material. Furthermore, the addition of a material, into a mixing region as a dopant, which is capable of converting triplet excitation energy into luminescence, also falls under the scope of the present invention. A concentration gradient may also be provided in the mixing region.

In addition, it is desirable that the directions used during evaporation be diagonal so as to intersect at the locations of the evaporation materials if a plurality of organic compounds are provided in one evaporation source holder, so that the organic compounds mix with each other. Further, four evaporation materials (for example, two types of host materials as evaporation materials a, and two types of dopant materials as evaporation materials b) may be provided to the evaporation source holder in order to perform co-evaporation. Further, when pixel size is small (or when the gap between each insulator is small), film formation can be performed precisely by dividing an inside portion of the container into four divisions, and performing co-evaporation by suitably evaporating from each of the divisions.

Furthermore, the gap distance d between the substrate and the evaporation source holder is shortened to, typically equal to or less than 30 cm, and preferably from 5 cm to 15 cm, and therefore there is a fear in that an evaporation mask will also be heated. It is therefore desirable to form the evaporation mask by using a metallic material having a low thermal expansion coefficient, which does not tend to deform due to heat (the following materials, for example: tungsten, tantalum, chromium, nickel, or molybdenum, which are high melting point metals; an alloy metal containing one of these metals; stainless steel; Inconel; or Hastelloy). A low thermal expansion alloy of 42% nickel and 58% iron or the like can be used, for example. Further, a mechanism for circulating a cooling medium (cooling water or a cooling gas) to the evaporation mask may also be provided in order to cool the heated evaporation mask.

It is preferable to generate a plasma within the film formation chamber by using a plasma generating means, gasify evaporants adhering to the mask, and evacuate the gasified evaporants to the outside of the film formation chamber in order to clean off the evaporants adhering to the mask. A separate electrode is therefore formed on the mask, and a high frequency electric power source is connected to one of the electrodes. It is thus preferable to form the mask by using a conductive material.

Note that the evaporation mask is used when selectively forming an evaporated film on a first electrode (cathode or anode), and is not particularly necessary if forming the evaporated film over the entire surface.

Further, the film formation chamber has a gas introducing means for introducing one gas, or a plurality of gasses selected from the group consisting of Ar, H, F, $NF_3$, and O, and a means for evacuating the gasified evaporants. It thus becomes possible to clean the inside of the evaporation chamber during maintenance, without exposing it to the ambient atmosphere, in accordance with the structure discussed above.

Further, the apparatus is characterized in that the evaporation source holder is rotated when switching between the x-axis direction and the y-axis direction in each of the structures described above. The film thickness can be made uniform by rotating the evaporation source holder.

Further, the apparatus is characterized in that the hole of the opening surface area S2, which is smaller than the opening surface area S1 of the container, is opened in the shutter in each of the structures described above. Pressure within the container is made to leak out so as not to become high pressure by forming the minute hole in the shutter.

Further, the apparatus is characterized in that a film thickness monitor is formed in the evaporation source holder in each of the structures described above. The film thickness can also be made uniform by adjusting the moving speed of the evaporation source holder in accordance with values measured by the film thickness monitor.

Further, the inert gas element in each of the structures described above is one element or a plurality of elements selected from the group consisting of He, Ne, Ar, Kr, and Xe. Of those, Ar is inexpensive, which is therefore preferable.

Further, a process for setting an EL material into the film formation chamber before evaporation, an evaporation process, and the like can be considered as the main processes during which there is a fear in that impurities such as oxygen and moisture will contaminate the evaporated EL materials or metallic materials.

It is therefore preferable to provide a glove in a preprocessing chamber coupled to the film formation chamber, move the glove from the film formation chamber to the preprocessing chamber for each evaporation source, and set the evaporation material into the evaporation source in the preprocessing chamber. That is, a manufacturing apparatus in which the evaporation source is moved to the preprocessing chamber is provided. The evaporation source can thus be set while maintaining the cleanliness level of the film formation chamber Further, a brown colored glass bottle is normally used for storing the EL material, and the bottle is closed by using a plastic cap. The sealing level of the container in which the EL material is stored can also be considered to be insufficient.

A predetermined amount of the evaporation material placed in the container (glass bottle) is taken out when performing film formation by evaporation, and transferred to a container (typically, a crucible or evaporation boat) disposed in a position within the evaporation apparatus that opposes an object on which a film is to be formed. However, there is a fear in that impurities will mix in during transfer operation. That is, there is a possibility of contamination by an impurity such as oxygen or moisture, which is one cause of EL element deterioration.

Performing the transfer operation from the glass bottle to the container manually can be considered, for example, within the preprocessing chamber, which is provided with a glove or the like. However, a vacuum cannot be provided if the preprocessing chamber is provided with a glove, and the operation is performed at ambient pressure. It is therefore difficult to remove as much moisture and oxygen within the preprocessing chamber as possible, even if the operation is performed in a nitrogen atmosphere, for example. The use of a robot can be considered, but the evaporation materials are powdery, and therefore it is difficult to manufacture a robot for transfer operation. Accordingly, it is difficult to make a continuous closed system capable of avoiding impurity contamination, in which complete automation is made from a step of forming an EL layer on a lower portion electrode through a step of forming an upper portion electrode.

The present invention is one in which the prevention of impurity contamination into a high purity evaporation material is achieved in a manufacturing system that stores EL materials and metallic materials directly in prearranged containers disposed in an evaporation apparatus, without using conventional containers, which are typically brown color glass bottles or the like, as containers for storing the EL materials. Further, sublimation purification may also be performed directly in the prearranged containers disposed in the evaporation apparatus, without dividing and receiving the evaporation materials obtained, when the EL material evaporation materials are received directly. The present invention makes it possible to handle even more very highly purified evaporation materials, which are expected in the future. Further, the metallic materials may be received directly in the prearranged containers disposed in the evaporation apparatus, and evaporation may be performed by resistance heating.

Furthermore, it is also preferable to similarly transport other components, such as the film thickness monitors (liquid crystal oscillators or the like) and shutters, and dispose them within the evaporation apparatus without exposure to the ambient atmosphere.

It is desirable that a light emitting device manufacturer who uses the evaporation apparatus entrust the work for receiving the evaporation materials directly in the containers, which are disposed in the evaporation apparatus, to a materials manufacturer that manufactures and/or sells the evaporation materials.

Further, a fear of impurity contamination depends upon the conventional transferring operation by the light emitting device manufacturer, no matter how highly pure the EL materials supplied by the material manufacturer are. The purity of the EL materials cannot be maintained, and there is a limit to their purity. In accordance with the present invention, extremely high purity EL materials obtained by the material manufacturer can be maintained by the light emitting device manufacturer and the material manufacturer cooperating in an endeavor to reduce impurity contamination. The light emitting device manufacturer can thus perform evaporation without a reduction in the material purity.

An embodiment of a transportation container is explained in detail using FIG. 6. A second container used for transportation and divided into an upper portion 621a and a lower portion 621b includes: a fixing means 706 for fixing a first container provided in the upper portion of the second container; a spring 705 for applying pressure to the fixing means; a gas introduction port 708 that is provided in the lower portion of the second container, and which becomes a gas pathway for maintaining a reduced pressure in the second container; an O-ring 707 that fixes the upper portion container 621a and the lower portion container 621b; and a fastener 702. A first container 701, in which a purified evaporation material is enclosed, is disposed within the second container. Note that the second container may be formed by a material that contains stainless steel, and the first container may be formed by a material containing titanium.

The purified evaporation material is enclosed in the first container 701 by the material manufacturer. The upper portion 621a and the lower portion 621b of the second container are joined through the O-ring 707, and the upper portion container 621a and the lower portion container 621b are fixed by the fastener 702. The first container 701 is thus enclosed within the second container. The inside of the second container is then reduced in pressure through the gas introduction portion 708, and in addition, its atmosphere is replaced by a nitrogen atmosphere. The spring 705 is then adjusted, and the first container 701 is fixed by the fixing means 706. Note that a drying agent may also be disposed within the second container. Even tiny amounts of oxygen and moisture can be prevented from adhering to the evaporation material if the inside of the second container is made vacuum, is reduced in pressure, or is maintained at a nitrogen atmosphere.

The containers are transported to the light emitting device manufacturer in this state, and the first container 701 is directly installed into a processing chamber. Thereafter, the evaporation material is sublimated next by heat treatment, and the formation of an evaporated film is performed.

A mechanism for installing the first container in the film formation chamber, which is sealed and transported in the second container, is explained next using FIGS. 4A and 4B, and FIGS. 5A and 5B. Note that FIGS. 4A and 4B, and FIGS. 5A and 5B are diagrams that show the first container during transportation.

FIG. 4A shows a top view of an installation chamber 805. The installation chamber 805 includes a table 804 on which the first container 701 or the second container is set, an evaporation source holder 803, and a transporting means 802 for transporting the first container. FIG. 4B shows a perspective view of the installation chamber. Further, the installation chamber 805 is disposed so as to be adjacent to a film formation chamber 806. It is possible to control the atmosphere of the installation chamber through the gas introduction port by using a means for controlling the atmosphere. Note that the transporting means of the present invention is not limited to structures like the one shown in FIGS. 4A and 4B, in which sides of the first container are sandwiched. Structures in which the first container is sandwiched (picked up) from above the first container may also be employed.

The second container is disposed on the table 804 in the installation chamber 805 in a state where the fastener 702 is released. The inside of the installation chamber 805 is then placed into a reduced pressure state by the means for controlling the atmosphere. The second container reaches a state at which it can be opened when the pressure within the installation apparatus becomes equal to the pressure within the second container. The upper portion 621a of the second container is then removed by using the transporting means 802, and the first container 701 is disposed on the evaporation source holder 803. Note that, although not shown in the figures, a location for disposing the removed upper portion 621a may be suitably provided. The evaporation source holder 803 is then moved from the installation chamber 805 to the film formation chamber 806.

Thereafter, the evaporation material is then sublimated by a heating means provided in the evaporation source holder 803, and film formation begins. When a shutter (not shown) formed in the evaporation source holder 803 is opened during film formation, the sublimated evaporation material will scatter toward the substrate and deposit thereupon, thus forming a light emitting layer (including hole transporting layers, hole injecting layers, electron transporting layers, and electron injecting layers).

The evaporation source holder 803 is then returned to the installation chamber 805 after evaporation is complete. The first container 701, which is disposed in the evaporation source holder 803, is then moved to a lower portion container (not shown) of the second container, which is disposed on the table 804, by the transporting means 802, and is sealed by the upper portion container 621a. It is preferable to seal the first container, the upper portion container 621a, and the lower portion container at this point by combining them during transportation. In this state, the installation chamber 805 is set to ambient atmospheric pressure, the second container is taken out from the installation chamber, the fastener 702 is fixed, and this assembly is sent to the material manufacturer.

A mechanism for disposing a plurality of the first containers, which are sealed in the second container and transported, into a plurality of the evaporation source holders is explained next using FIGS. 5A and 5B. This mechanism differs from that of FIGS. 4A and 4B.

FIG. 5A shows a top view of an installation chamber 905. The installation chamber 905 includes a table 904 on which a first container or a second container is set, a plurality of evaporation source holders 903, a plurality of transporting means 902 for transporting the first containers, and a rotating table 907. FIG. 5B shows a perspective view of the installation chamber 905. Further, the installation chamber 905 is disposed so as to be adjacent to a film formation chamber 906. It is possible to control the atmosphere in the installation chamber through a gas introduction port by using a means for controlling the atmosphere.

The plurality of first containers 701 can be disposed in the plurality of evaporation source holders 903 by using the rotating table 907 and the plurality of transporting means 902, and the operation for moving the plurality of first containers from the plurality of evaporation source holders to the table 904 can be performed with good efficiency after film formation is complete. It is preferable to dispose the first containers in the transported second containers at this point.

Note that the rotating table 907 may have a rotating function in order to increase the efficiency of transporting the evaporation source holders when evaporation is started, and the evaporation source holders when evaporation is completed. The rotating table 907 is not limited to the structure discussed above. The rotating table 907 may have a function for moving horizontally, and the plurality of first containers may be disposed in the evaporation source holders by using a moving means 902 at the stage when the evaporation source holders, which are disposed in the film formation chamber 906, are approached.

Impurities can be reduced to a minimum in evaporated films formed by an evaporation apparatus like that discussed above. High reliability and brightness can be achieved if light emitting elements are completed by using these types of evaporated films. Further, containers sealed by a material manufacturer can be installed directly into the evaporation apparatus in accordance with this type of manufacturing system, and therefore the adherence of oxygen and moisture on evaporation materials can be prevented. The present invention makes it possible to handle even more very highly purified light emitting layers in the future. Further, material waste can be eliminated by once again purifying the containers in which residual evaporation materials remain. In addition, the first containers and the second containers can be reutilized, thus lowering costs.

Further, the present invention may reduce the processing time per single substrate. As shown in FIG. 10, a multi-chamber manufacturing apparatus provided with a plurality of film formation chambers has a first film formation chamber for depositing onto a first substrate, and a second film formation chamber for depositing onto a second substrate. A plurality of organic compound layers are laminated concurrently (in parallel) in each of the film formation chambers, thus reducing the processing time per single substrate. That is, the first substrate is taken out from a transporting chamber and placed in the first film formation chamber, and vapor deposition on the first substrate is performed. During this time, the second substrate is taken out from the transporting chamber and placed in the second film formation chamber, and vapor deposition is also performed on the second substrate.

Six film formation chambers are provided in a transporting chamber 1004*a* in FIG. 10, and it is therefore possible to place six substrates into the respective film formation chambers and perform evaporation in order and concurrently. Further, evaporation can also be performed during maintenance of one film formation chamber by using the other film formation chambers, without temporarily stopping the production line.

Further, hole transporting layers, light emitting layers, and electron transporting layers corresponding to the colors R, G, and B may be laminated in succession in different film formation chambers if a full color light emitting device is being manufactured in FIG. 10. Furthermore, the hole transporting layers, the light emitting layers, and the electron transporting layers corresponding to R, G, and B may also be laminated in succession in the same film formation chamber. A film formation apparatus like that shown in FIGS. 2A and 2B may be used if the hole transporting layers, the light emitting layers, and the electron transporting layers corresponding to R, G, and B are laminated in succession in the same film formation chamber. That is, an evaporation apparatus, in which a plurality of evaporation source holders (evaporation source holders that move in the x-direction or the y-direction), at least three or more, are provided in one film formation chamber, may be employed. Note that it is preferable to use different evaporation masks corresponding to R, G, and B in order to avoid color mixing. It is also preferable to perform mask alignment before vapor deposition, thus forming films only in desired regions. The same evaporation mask may be used for R, G, and B in order to reduce the number of masks. Mask alignment may be performed before vapor deposition by shifting the mask position for each color, thus forming films only in desired regions.

Further, the present invention is not limited to a structure in which the hole transporting layer, the light emitting layer, and the electron transporting layer are laminated in succession in the same chamber. The hole transporting layer, the light emitting layer, and the electron transporting layer may also be laminated in succession in a plurality of coupled chambers.

Further, although a structure is discussed as a typical example in the above explanation, in which three layers, a hole transporting layer, a light emitting layer, and an electron transporting layer, are laminated as an organic compound containing layer and disposed between a cathode and an anode, the present invention is not limited to this particular structure. Structures in which a hole injecting layer, a hole transporting layer, a light emitting layer, and an electron transporting layer are laminated in order on an anode may also be used. In addition, structures in which a hole injecting layer, a hole transporting layer, a light emitting layer, an electron transporting layer, and an electron injecting layer are laminated in order on an anode may also be used. Further, two layer structures and single layer structures may also be used. A fluorescent pigment or the like may also be doped into the light emitting layer. Further, light emitting layers having hole transporting characteristics, and light emitting layers having electron transporting characteristics may also be used as light emitting layers. Furthermore, the layers may all be formed by using low molecular weight materials, and in addition, one or more layers may be formed by using high molecular weight materials. Note that all layers formed between a cathode and an anode are referred to generically as an organic compound containing layer (EL layer) in this specification. The hole injecting layers, the hole transporting layers, the light emitting layers, the electron transporting layers, and the electron injecting layers discussed above are therefore all included in the category of EL layers. Further, the organic compound containing layer (EL layer) may also contain inorganic materials such as silicon.

Note that a light emitting layer (EL element) includes an organic compound containing layer (hereinafter referred to as an EL layer) in which luminescence (electroluminescence) can be obtained by the application of an electric field, an anode, and a cathode. As for luminescence in organic compounds, there are a light emission when returning to a base state from a singlet excitation state (fluorescence), and a light emission when returning to a base state from a triplet excitation state (phosphorescence). Light emitting devices manufactured in the present invention can apply to both types of light emission.

Further, there are no limitations placed on a method of driving a screen display in the light emitting device of the present invention. For example, a dot sequential driving method, a line sequential driving method, a screen sequential driving method, or the like may be used. Typically, a time gray scale driving method or an area gray scale method may be suitably applied as a line sequential driving method. Further, image signals input to source lines of the light emitting device may be analog signals or digital signals. Driving circuits and the like may be suitably designed in accordance with the image signal type.

Furthermore, light emitting elements formed by a cathode, an EL layer, and an anode are referred to as EL elements within this specification. There are two methods of forming the EL elements, a method of forming EL layers between two types of stripe shape electrodes that are formed so that they mutually intersect (simple matrix method), and a method of forming EL layers between pixel electrodes and opposing electrodes that are disposed in a matrix shape and are connected to TFTs (active matrix method).

BRIEF DESCRIPTION OF THE DRAWINGS

In the accompanying drawings:

FIGS. 2A and 2B are diagrams showing movement pathways of an evaporation source holder of the present invention, and FIGS. 2C and 2D are diagrams of movement of evaporation source holder at substrate circumstantial portion;

FIGS. 4A and 4B are diagrams showing crucible transportation to an evaporation source holder in an installation chamber;

FIGS. 5A and 5B are diagrams showing crucible transportation to an evaporation source holder in an installation chamber;

FIGS. 7A and 7B are diagrams showing the opening and closing of a shutter on an evaporation source holder (one container);

FIGS. 8A and 8B are diagrams showing the opening and closing of shutters on evaporation source holders (a plurality of containers);

FIG. 9 is a diagram showing a sequence for a manufacturing apparatus of the present invention;

FIG. 11 is a diagram showing an example of a sequence (Embodiment 2);

FIGS. 12A and 12B are diagrams showing an example of a sequence (Embodiment 2)

DETAILED DESCRIPTION OF THE PREFERRED EMBODIMENTS

Figure 1:
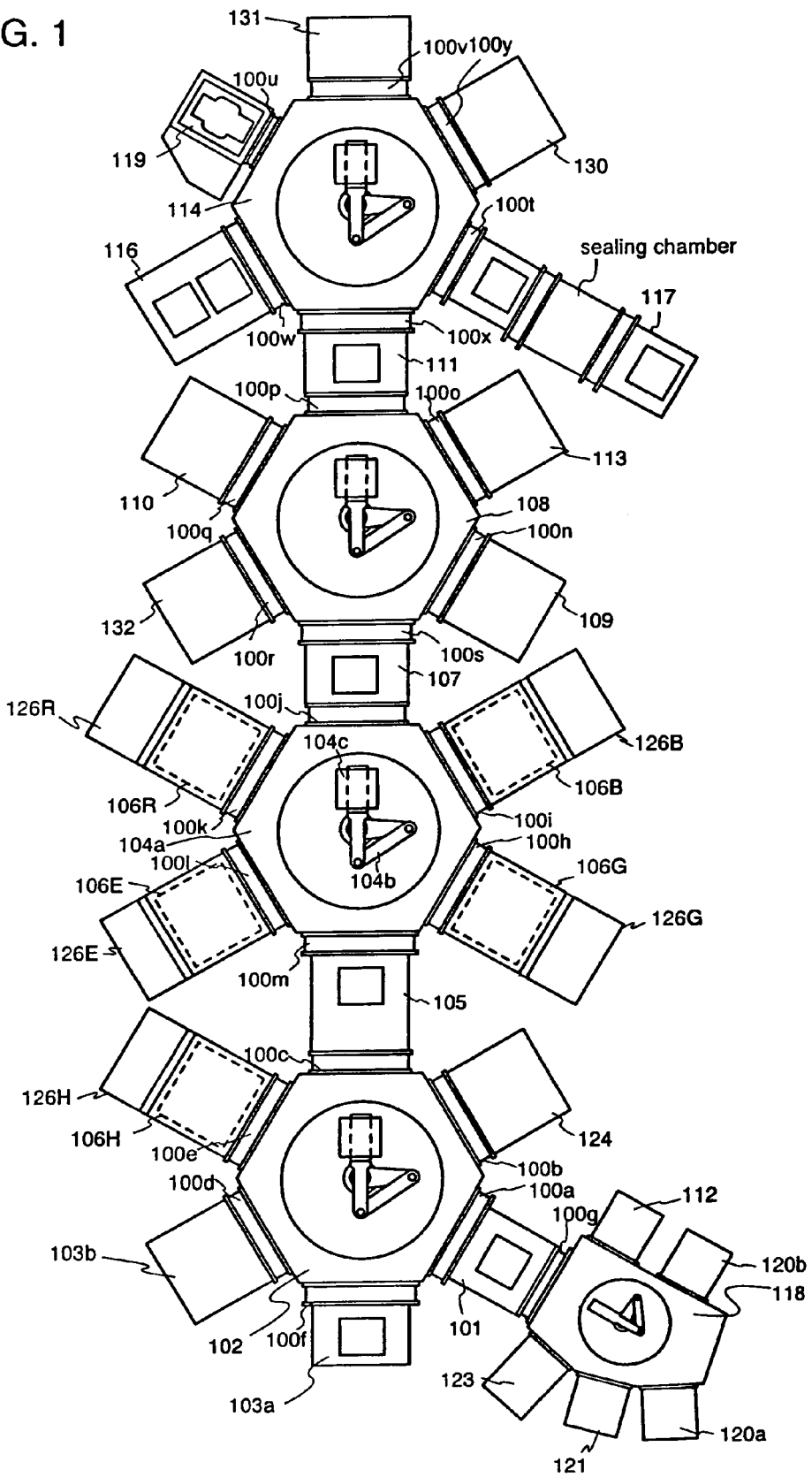
FIG. 1 is a diagram showing a manufacturing apparatus of the present invention.
Figure 3:
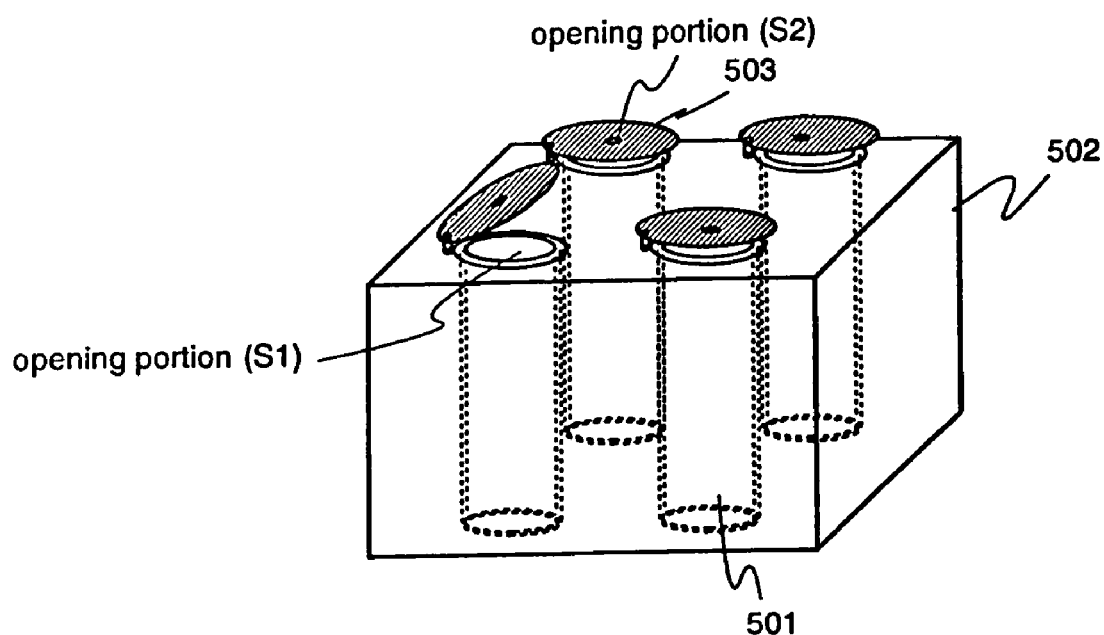
FIG. 3 is a diagram showing an evaporation source holder (having a hole in its shutter) of the present invention.
Figure 6:
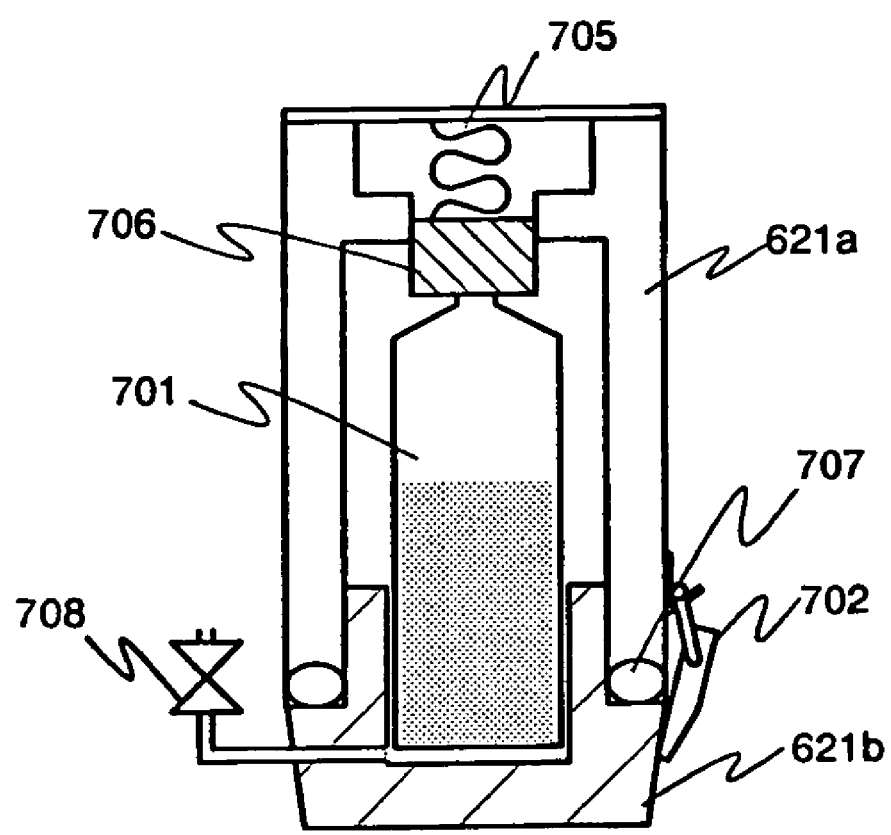
FIG. 6 is a diagram showing a transportation container of the present invention.

An embodiment mode of the present invention is explained below.

An evaporation source holder that is made to move in an x-direction or a y-direction within a film formation chamber is explained here using FIGS. 7A and 7B.

FIG. 7A is a diagram that shows a state in which heat treatment is performed by a heating means 303 connected to an electric power source 307 with a sliding shutter 306 in an open state and an evaporation material 302 in a container 301 is made to evaporate. Note that a film thickness monitor 305 is attached to the evaporation source holder 304. Film thickness can be controlled with the shutter in the open state by adjusting the heat treatment temperature and the moving speed of the evaporation source holder 304 by the electric power source 307.

On the other hand, FIG. 7B shows the sliding shutter 306 in a closed state. A hole is opened in the shutter 306, and a material emitted obliquely from the hole moves in a direction toward the film thickness monitor 305. Note that, although a gap is opened between the container 301 and the shutter 306a in the example shown in FIGS. 7A and 7B, the gap may be narrow, or there may be no gap at all. That is, the container 301 and the shutter 306 may be in intimate contact. Pressure inside the container can leak out even if they are in intimate contact because the minute hole is opened.

Further, although an example of the evaporation source holder provided with one of the containers 301 is shown in FIGS. 7A and 7B, an evaporation source holder provided with a plurality of containers 202 in order to perform co-evaporation or the like is shown in FIGS. 8A and 8B.

Film thickness monitors 201 are provided in each of the two containers 202, and one of the containers is disposed with inclined with respect to a fixed substrate 200, as shown in FIGS. 8A and 8B. A heater is used as a heating means, and evaporation is performed by a resistive heating method. Note that the evaporation source holder is moved below the substrate with the shutter in an open state during evaporation, as shown in FIG. 8A. Further, evaporation is stopped by closing the shutter 204 having the minute hole if there is no evaporation source holder below the substrate 200.

The evaporation source holder as described above is moved in a zigzag manner in the film formation chamber on a planar plane, as shown in FIGS. 2A and 2B.

The incursion of moisture into layers that contain organic compounds is prevented in a multi-chamber manufacturing apparatus (one example is shown in FIG. 1) provided with the film formation chamber. It is therefore possible to perform processing from the formation of the organic compound containing layers up through sealing operations without exposure to the ambient atmosphere.

A further detailed explanation of the present invention having the structure described above is provided by using the embodiments shown below.

EMBODIMENTS

Embodiment 1

An example of a multi-chamber manufacturing apparatus in which manufacturing processes from a first electrode up through sealing are automated is shown in FIG. 1 in this embodiment.

FIG. 1 is a multi-chamber manufacturing apparatus that includes gates 100a to 100y; an extraction chamber 119; transporting chambers 102, 104a, 108, 114, and 118; delivery chambers 105, 107, and 111; a stocking chamber (loading chamber) 101; a first film formation chamber 106H; a second film formation chamber 106B; a third film formation chamber 106G; a fourth film formation chamber 106R; a fifth film formation chamber 106E; other film formation chambers 109 (ITO or IZO film), 110 (a metal film), 112 (spin coat or ink jet), 113 (SiN film or SiOx film), 131 (sputtering chamber), and 132 (sputtering chamber); installation chambers 126R, 126G, 126B, 126E, and 126H for disposing evaporation sources; preprocessing chambers 103a (bake or $O_2$ plasma, $H_2$ plasma, Ar plasma) and 103b (vacuum bake); a sealing chamber 116; a mask stocking chamber 124; a sealing substrate stocking chamber 130; cassette chambers 120a and 120b; and a tray loading stage 121.

Procedures are shown below for placing a substrate, on which a thin film transistor, an anode (first electrode), and an insulator that covers edge portions of the anode are formed in advance, in the manufacturing apparatus shown in FIG. 1 and then manufacturing a light emitting device.

The substrate is first set in the cassette chamber 120a or the cassette chamber 120b. Large size substrates (for example, 300 mm×360 mm) are set into the cassette chamber 120a or 120b, while normal size substrates (for example, 127 mm×127 mm) are transported to the tray loading stage 121, and a plurality of substrates are set in the tray (for example, 300 mm×360 mm).

The substrate, on which a plurality of the thin film transistors, the anode, and the insulator that covers the edge portions of the anode are formed, is then transported to the transporting chamber 118.

Further, it is preferable to perform annealing for degassing within a vacuum before forming films that contain organic compounds in order to remove moisture and other gasses contained in the substrate. The substrate may be transported to the preprocessing chamber 128 that is coupled to the transporting chamber 118, and annealing may be performed there.

Further, the film formation chamber 112 may form a hole injecting layer made from a polymeric material by using an inkjet method, a spin coating method, or the like. An aqueous solution of poly(ethylene dioxythiophene)/poly(styrene sulfonic acid) (PEDOT/PSS), an aqueous solution of polyaniline/camphor sulfonic acid (PANI/CSA), PTPDES, Et-PIT-DEK, PPBA, or the like, which acts as a hole injecting layer (anode buffer layer) may be applied over the entire surface of the first electrode (anode), and fired. It is preferable to perform firing in a baking chamber 123. Levelness can be improved for cases in which a hole injecting layer made from a polymeric material formed by an application method using a spin coater or the like. The coverage and uniformity in film thickness are made satisfactory for films formed thereupon. In particular, uniform light emission can be obtained because the film thickness of light emitting layers becomes uniform.

In this case, it is preferable to perform vacuum heating (at 100 to 200° C.) after forming the hole injecting layer by application, and immediately before film formation by evaporation. Note that light emitting layer formation may be performed by evaporation, without exposure to the ambient atmosphere, if: the surface of the first electrode (anode) is cleaned by using a sponge; a film of an aqueous solution of poly(ethylene dioxythiophene)/poly(styrene sulfonic acid) (PEDOT/PSS), which is formed on the entire surface by spin coating and has a film thickness of 60 nm, is provisionally fired at 80° C. for 10 minutes, and then fired at 200° C. for one hour; and in addition, vacuum heating (heating for 30 minutes at 170° C., then cooling for 30 minutes) is performed immediately before evaporation, for example. In particular, the influence of unevenness or minute particles existing on the surface of an ITO film can be reduced by making the PEDOT/PSS film thick.

Further, PEDOT/OSS does not have good wettability if applied on top of an ITO film. It is therefore preferable to increase the wettability by washing with purified water once after performing a first application of PEDOT/PSS solution by spin coating. A second application of PEDOT/PSS solution may be performed by spin coating, and firing may be performed, thus forming a film having good uniformity. Note that washing the substrate with purified water once after performing the first application is effective in improving surface quality, and is also effective in removing minute particles and the like.

Further, film formation is performed over the entire surface if forming PEDOT/PSS by spin coating, and therefore it is preferable to selectively remove the PEDOT/PSS from edge surfaces and circumferential portions of the substrate, and regions that connect to terminal portions, cathodes, or lower portion wirings, and the like. It is preferable to perform removal by employing $O_2$ ashing or the like in the preprocessing chamber 103a.

The substrate is next transported from the transporting chamber 118, which is provided with a substrate transporting mechanism, to the stocking chamber 101. A substrate inverting mechanism is provided in the stocking chamber 101 in the manufacturing apparatus of this embodiment, and the substrate can be suitably inverted. It is preferable that the stocking chamber 101 be coupled to a vacuum evacuation processing chamber, and that the stocking chamber 101 be set to ambient atmospheric pressure by introducing an inert gas after vacuum evaporation.

The substrate is then transported to the transporting chamber 102, which is coupled to the stocking chamber 101. It is preferable to perform vacuum evacuation of the inside of the transporting chamber 102 in advance, and maintain a vacuum there, so that as little moisture and oxygen as possible will exist there.

Further, a magnetic levitation turbomolecular pump, a cryo pump, or a dry pump is provided as the vacuum evacuation processing chamber. It is thus possible to achieve an ultimate pressure of $10^{-5}$ to $10^{-6}$ Pa in the transporting chamber that is coupled to the stocking chamber. In addition, back diffusion of impurities from the pump side and from the evacuation system can be controlled. An inert gas such as nitrogen or a noble gas is used as the gas introduced in order to prevent the introduction of impurities within the apparatus. A gas that has been highly purified by a gas purifier before being introduced within the apparatus is used. It is therefore necessary to provide a gas purifier so that the gas is introduced into the evaporation apparatus after being highly purified. Oxygen, moisture, and other impurities contained in the gas can thus be removed in advance, and therefore these impurities can be prevented from being introduced to the inside of the apparatus.

Further, the substrate may be transported to the preprocessing chamber 103a, and a laminate of organic compound films may be selectively removed if it is intended to remove the organic compound containing film formed in an unnecessary portion. The preprocessing chamber 103a has a plasma generating means, and performs dry etching by exciting one gas, or a plurality of gases selected from the group consisting of Ar, H, F, and O, thus generating a plasma.

Further, it is preferable to perform vacuum heating immediately before evaporation of the organic compound containing film in order to eliminate shrinkage. The substrate is transported to the preprocessing chamber 103a, and annealing for degassing is performed in a vacuum (pressure equal to or less than $5 \times 10^{-3}$ Torr (0.665 Pa), preferably from $10^{-6}$ to $10^{-4}$ Pa) in order to thoroughly remove moisture and other gasses contained in the substrate. If an organic resin film is used as an interlayer insulating film material or barrier material, in particular, organic resin materials tend to easily adsorb moisture in some cases, and in addition, there is a fear of degassing. It is therefore effective to perform 30 minutes of natural cooling after heating at a temperature of 100 to 250° C., preferably of 150° C. to 200° C., for a period equal to or greater than 30 minutes, for example, and then perform vacuum heating for removing adsorbed moisture before forming the organic compound containing layer.

Figure 13:
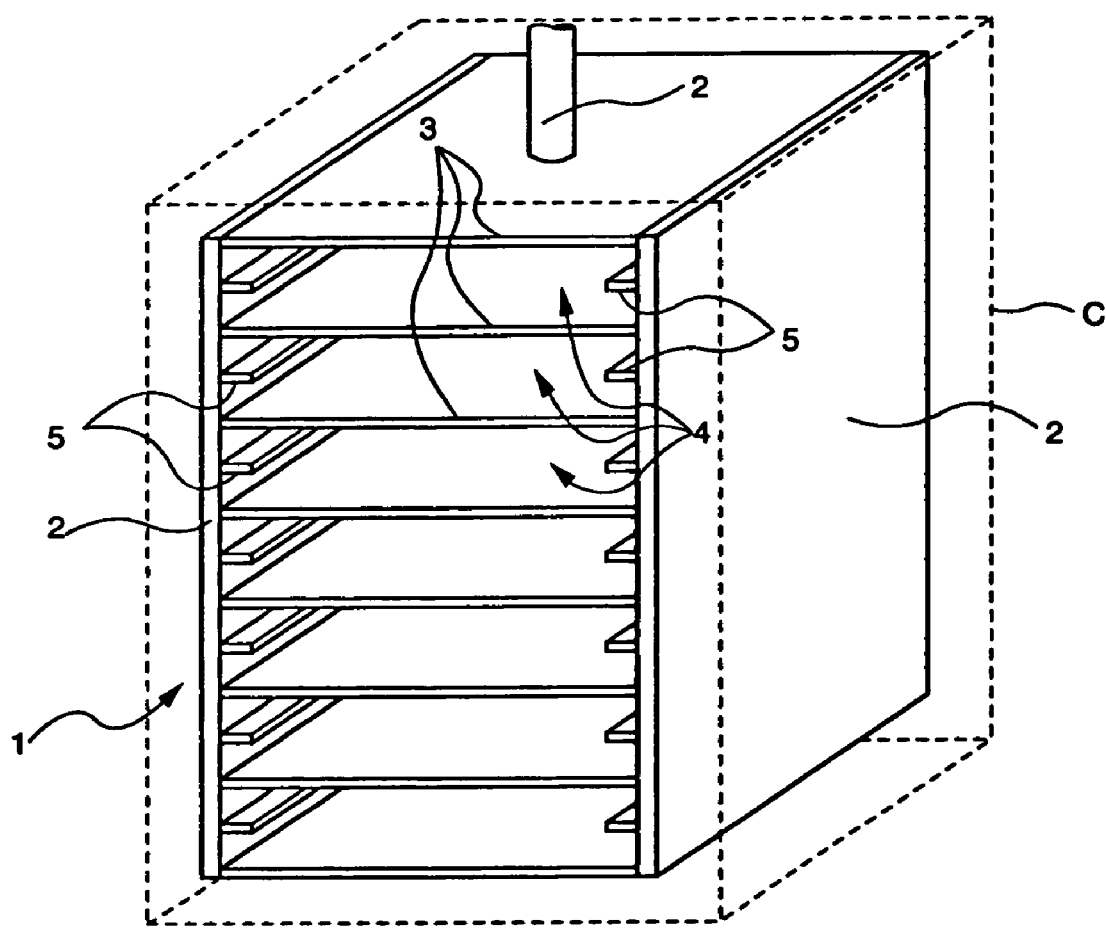
FIG. 13 is a diagram showing a multiple-stage vacuum heating chamber.

Further, it is preferable that the preprocessing chamber 103b should be a multiple-stage vacuum heating chamber as shown in FIG. 13. In FIG. 13, C denotes a vacuum chamber, 1 denotes a constant temperature bath, 2 denotes a panel heater, 3 denotes a uniform temperature board (a plate heater), 4 denotes a slot for heating substrates, 5 denotes a substrate holder. Heat is transmitted to the uniform temperature board 3 by a thermal conduction from the panel heater 2, and the uniform temperature board 3 is heated. Substrates to be processed, which are held in each slot 4, are uniformly heated by a thermal radiation of an infrared light, etc. It is possible to place one substrate in one slot 4, that is, seven substrates in total in the constant temperature bath 1.

The substrate is then transported from the transporting chamber 102 to the film formation chamber 106H (EL layer for HTL and HIL) after the aforementioned vacuum heating, and evaporation is performed. The substrate is next transported from the transporting chamber 102 to the delivery chamber 105, and in addition, is transported from the delivery chamber 105 to the transporting chamber 104a without being exposed to the ambient atmosphere.

The substrate is then suitably transported to the film formation chambers 106R (EL layer for red), 106G (EL layer for green), 106B (EL layer for blue), and 106E (EL layer for ETL and EIL) that is coupled to the transporting chamber 104a, and low molecular weight organic compound layers that become hole injecting layers, hole transporting layers, and light emitting layers are formed. The film formation chambers 106R, 106G, 106B, 106E, and 106H are explained here.

A moveable evaporation source holder is installed in each of the film formation chambers 106R, 106G, 106B, 106E, and 106H. A plurality of the evaporation source holders are prepared, and they are provided with a plurality of containers (crucibles) in which EL materials are enclosed. The evaporation source holders are installed in the film formation chambers in this state.

It is preferable that the installation of the EL materials to the film formation chambers be performed using the manufacturing system shown below. That is, it is preferable that film formation be performed using containers (typically crucibles) within which the EL materials are received in advance by a material manufacturer. In addition, it is preferable to perform installation without exposure to the ambient atmosphere. At the time of transportation from the material manufacturer, it is preferable that the crucibles be introduced to the film formation chambers in a state where they are sealed in second containers. It is desirable that the installation chambers 126R, 126G, 126B, 126H, and 126E, which have vacuum evacuation means coupled to the film formation chambers 106R, 106G, 106B, 106H, and 106E, respectively, be placed under a vacuum, or under an inert gas atmosphere, and that the crucibles be removed from the second containers within the vacuum, or within the inert gas atmosphere, and then be set in film formation chambers. The crucibles and the EL materials received in the crucibles can thus be prevented from being contaminated. Note that it is also possible to stock metal masks in the installation chambers 126R, 126G, 126B, 126H, and 126E.

Light emitting elements that display single color (specifically, white) or full color (specifically, red, green, and blue) light emission overall can be formed by suitably selecting the EL materials installed in the film formation chambers 106R, 106G, 106B, 106H, and 106E.

Note that organic compound layers that emit white color light can be roughly divided into two types for cases where the light emitting layer has different colors of light emission for lamination. One is a three wavelength type containing three primary colors, i.e., red, green, and blue, while the other is a two wavelength type that utilizes a complementary color relationship between blue and yellow, or between cyan and orange. A plurality of evaporation source holders are prepared in one film formation chamber if white color light emitting elements that use the three wavelength type of light emission are obtained. An aromatic diamine (TPD) is enclosed in a first evaporation source holder for forming a white color light emitting layer, p-EtTAZ is enclosed in a second evaporation source holder for forming a white color light emitting layer, and $Alq_3$ is enclosed in a third evaporation source holder for forming a white color light emitting layer. An EL material in which Nile Red, a red color light emitting pigment, is added to $Alq_3$ is enclosed in a fourth evaporation source holder for forming a white color light emitting layer, and $Alq_3$ is enclosed in a fifth evaporation source holder. The evaporation source holders are installed in each of the film formation chambers in this state. Movement of the first through the fifth evaporation source holders is then started in order, and evaporation and lamination are performed on the substrate. Specifically, TPD is sublimated from the first evaporation source holder due to heating, and is evaporated on the entire substrate surface. P-EtTAZ is sublimated next from the second evaporation source holder, $Alq_3$ is sublimated from the third evaporation source holder, $Alq_3$:Nile Red is sublimated from the fourth evaporation source holder, and $Alq_3$ is sublimated from the fifth evaporation source holder. The sublimated materials are evaporated over the entire substrate surface. A white color light emitting element can be obtained if a cathode is formed thereafter.

After suitably laminating the organic compound containing layers, and after transporting the substrate from the transporting chamber 104a to the delivery chamber 107, the substrate is next moved from the delivery chamber 107 to the transporting chamber 108, all without exposure to the ambient atmosphere.

The substrate is next transported to the film formation chamber 110 by a transporting mechanism installed within the transporting chamber 108, and a cathode is formed. The cathode is a metallic film (a film made from an alloy such as MgAg, MgIn, AlLi, CaN, or the like, or an element that resides in group 1 or group 2 of the periodic table and aluminum by co-evaporation) formed by an evaporation method using resistive heating. The cathode may also be formed in the film formation chamber 132 by using sputtering. Further, a film made from a transparent conductive film (ITO (indium tin oxide alloy), indium oxide zinc oxide alloy ($In_2O_3$—ZnO), zinc oxide (ZnO) or the like) may also be formed in the film formation chamber 109 by using sputtering.

Furthermore, the substrate may also be transported to the film formation chamber 113 that is coupled to the transporting chamber 108, and a protective film made from a silicon nitride film or a silicon oxynitride film may be formed. A target made from silicon, a target made from silicon oxide, or a target made from silicon nitride is provided here within the film formation chamber 113. For example, a silicon nitride film can be formed by using the target made from silicon and by making the atmosphere within the film formation chamber into a nitrogen atmosphere, or into an atmosphere that contains nitrogen and argon.

Light emitting elements having a laminate structure can be formed by the processes described above.

The substrate, upon which the light emitting elements are formed, is then transported from the transporting chamber 108 to the delivery chamber 111 without exposing to the ambient atmosphere, and in addition, the substrate is transported form the delivery chamber 111 to the transporting chamber 114. The substrate, upon which the light emitting elements are formed, is transported next from the transporting chamber 114 to the sealing chamber 116.

A sealing substrate is prepared and set into the loading chamber 117 from the outside. Note that it is preferable to perform annealing in advance within a vacuum in order to remove impurities such as moisture. A sealing material is then formed in which the sealing substrate is bonded to the substrate upon which the light emitting element is formed. At this time, the sealing material is formed in the sealing chamber. Then, the sealing substrate with the formed sealing material is transported to the sealing substrate stocking chamber 130. Note that a drying agent may also be formed on the sealing substrate in the sealing chamber. Note also that, although an example of forming a sealing material on the sealing substrate is shown here, the present invention is not limited to this structure. A sealing material may also be formed on the substrate having the light emitting elements formed thereon.

The substrate and the sealing substrate are then bonded in the sealing chamber 116, and UV light is then irradiated to the pair of bonded substrates by an ultraviolet light irradiation mechanism provided in the sealing chamber 116, thus setting the sealing material. Note that, although an ultraviolet light setting resin is used as the sealing material here, the present invention is not limited to the use of this material. Other materials may also be employed, provided that they are adhesive materials.

The pair of bonded substrates is next transported from the sealing chamber 116 to the transporting chamber 114, and then from the transporting chamber 114 to the extraction chamber 119, and removed. The pathways described above are shown by arrows in FIG. 9.

Processing thus takes place up through completely sealing the light emitting elements into a sealed space, without exposure to the ambient atmosphere, by using the manufacturing apparatus shown in FIG. 1. It therefore becomes possible to manufacture a light emitting device having high reliability. Note that, although the atmosphere inside the transporting chambers 114 and 118 is repeatedly changed from a vacuum to a nitrogen atmosphere at ambient pressure, it is preferable that a vacuum always be maintained inside the transporting chambers 102, 104a, and 108.

Note that, although not shown here, a control apparatus is provided for controlling the pathways in which the substrate is moved to each of the processing chambers, thus achieving complete automation.

Further, it is also possible to form upward emission (double sided emission) light emitting elements in the manufacturing apparatus shown in FIG. 1. An organic compound containing layer is formed on a substrate having a transparent conductive film (or a metallic film (TiN)) as an anode, and thereafter a transparent or a translucent cathode (for example, a laminate of a thin metallic film (Al, Ag) and a transparent conductive film) is formed.

Further, it is also possible to form bottom emission light emitting elements in the manufacturing apparatus shown in FIG. 1. An organic compound containing layer is formed on a substrate having a transparent conductive film as an anode, and thereafter a cathode made from a metallic film (Al, Ag) is formed.

Further, this embodiment can be freely combined with the embodiment mode.

Embodiment 2

An example having one portion that differs from the manufacturing apparatus of Embodiment 1 is disclosed in this embodiment. Specifically, an example of a manufacturing apparatus including a transporting chamber 1004a provided with six film formation chambers 1006R (EL layer for red), 1006G (EL layer for green), 1006B (EL layer for blue), 1006R' (EL layer for red), 1006G' (EL layer for green), and 1006B' (EL layer for blue) is shown in FIG. 10.

Figure 10:
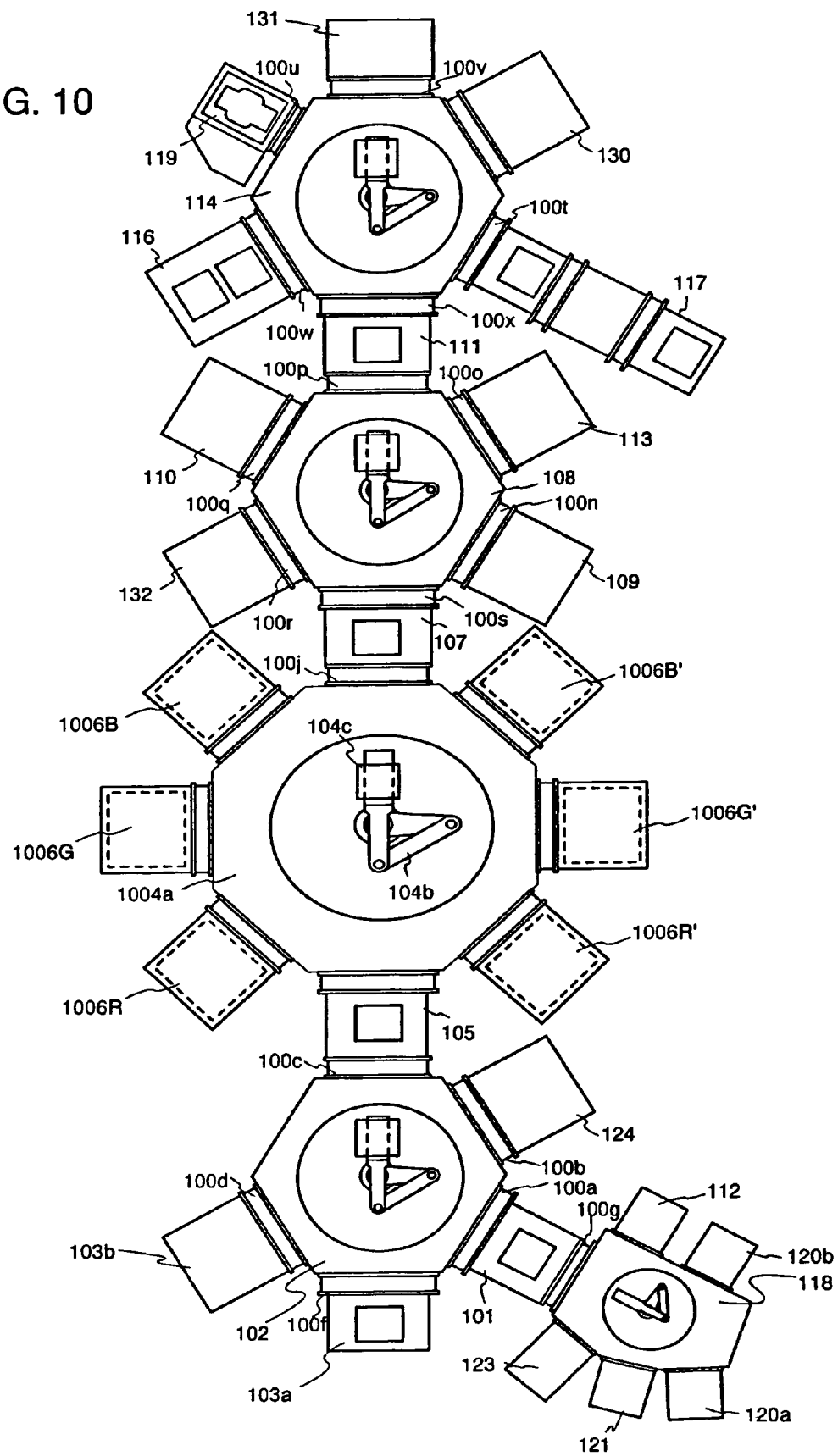
FIG. 10 is a diagram showing a manufacturing apparatus of the present invention (Embodiment 2)

Note that portions identical to those of FIG. 1 are shown by using the same reference numerals in FIG. 10. Further, explanations of portions identical to those of FIG. 1 are omitted here for brevity.

An example of an apparatus capable of manufacturing full color light emitting elements in parallel is shown in FIG. 10.

Similarly to Embodiment 1, vacuum heating is performed on substrates in the preprocessing chamber 103b, and the substrates are then transported from the transporting chamber 102 to the transporting chamber 1004a via the delivery chamber 105. Films are laminated on a first substrate through a pathway via the film formation chambers 1006R, 1006G, and 1006B, and films are laminated on a second substrate through a pathway via the film formation chambers 1006R', 1006G', and 1006B'. Throughput can thus be increased by performing evaporation on a plurality of substrates in parallel. Subsequent processes may be performed in accordance with Embodiment 1. A light emitting device can be completed by performing sealing after cathode formation.

Further, R, G, and B color hole transporting layers, light emitting layers, and electron transporting layers may also be laminated in three different film formation chambers, as shown in FIG. 11 showing the sequence from substrate insertion to substrate extraction. Note that mask alignment is performed before each evaporation in FIG. 11, so that the films are only formed in predetermined regions. It is preferable to use different masks for each of the different colors in order to prevent color mixing, and three masks are necessary in this case. The following procedures may be performed, for example, if a plurality of substrates are processed. The first substrate is placed in the first film formation chamber, and a layer that contains a red color light emitting organic compound is formed. The first substrate is then removed, and placed next in the second film formation chamber. The second substrate is placed in the first film formation chamber while a layer that contains a green color light emitting organic compound is formed on the first substrate, and a layer that contains the red color light emitting organic compound is formed on the second substrate. The first substrate is lastly placed in the third film formation chamber. The second substrate is placed in the second film formation chamber, and then the third substrate is placed in the first film formation chamber, while a layer that contains a blue color light emitting organic compound is formed on the first substrate. Laminations may thus be performed sequentially.

Further, the R, G, and B color hole transporting layers, light emitting layers, and electron transporting layers may also be laminated in the same film formation chamber, as shown in FIGS. 12A and 12B showing the sequence from substrate insertion to substrate extraction. Three type of material layers, corresponding to R, G, and B, may be formed selectively by performing mask positioning through shifting during mask alignment, as shown in FIG. 12B, if the R, G, and B color hole transporting layers, light emitting layers, and electron transporting layers are laminated consecutively in the same film formation chamber. Note that reference numeral 10 denotes a substrate in FIG. 12B, reference numeral 15 denotes shutters, reference numeral 17 denotes evaporation source holders, reference numeral 18 denotes evaporation materials, and reference numeral 19 denotes vaporized evaporation materials. States of shifting an evaporation mask 14 for each of the organic compound containing layers is shown. The mask is shared in this case, and only one mask is used.

Further, the substrate 10 and the evaporation mask 14 are disposed in a film formation chamber (not shown). Furthermore, the alignment of the evaporation mask 14 may be confirmed by using a CCD camera (not shown). Containers in which the evaporation materials 18 are enclosed are disposed in the evaporation source holders 17. The film formation chamber 11 is vacuum-evacuated to a degree of vacuum equal to or less than $5 \times 10^{-3}$ Torr (0.665 Pa), preferably from $10^{-6}$ to $10^{-4}$ Pa. Further, the evaporation materials are sublimated (gasified) in advance by resistive heating during evaporation, and scatter in the direction of the substrate 10 by opening the shutter 15 during evaporation. The sublimated evaporation material 19 scatters upward, and is selectively evaporated on the substrate 10 through an opening portion formed in the evaporation mask. Note that it is desirable that the film formation speed, the moving speed of the evaporation source holder, and the opening and closing of the shutter be made controllable by a microcomputer. It thus becomes possible to control the evaporation speed by the speed at which the evaporation source holder moves. Further, evaporation can be performed while measuring the film thickness of the evaporation film by using a liquid crystal oscillator provided in the film formation chamber. Changes in the mass of the film evaporated on the liquid crystal oscillator can be measured as changes in resonance frequency for cases where the film thickness of the evaporation film is measured by using the liquid crystal oscillator. In the evaporation apparatus, the gap distance d between the substrate 10 and the evaporation source holder 17 during evaporation is shortened to, typically equal to or less than 30 cm, preferably equal to or less than 20 cm, more preferably from 5 cm to 15 cm. The utilization efficiency and throughput of the evaporation materials is therefore markedly improved. Further, a mechanism capable of moving the evaporation source holder 17 in the x-direction and in the y-direction in the film formation chamber, with the evaporation source holder maintained in a horizontal orientation, is provided. The evaporation source holder 17 is moved here in a zigzag manner in a planar plane, as shown in FIG. 2A and FIG. 2B.

Further, if a hole transporting layer and an electron transporting layer are commonly used, the hole transporting layer is formed first, after which a light emitting layer made from a different material is selectively laminated by using a different mask, and then the electron transporting layer is laminated. Three masks are thus used in this case.

Furthermore, this embodiment can be freely combined with the embodiment mode or Embodiment 1.

In accordance with the present invention, substrate rotation is not necessary, and therefore an evaporation apparatus capable of handling large surface area substrates can be provided. Further, an evaporation apparatus capable of obtaining a uniform film thickness, even if large surface area substrates are used, can be provided.

Furthermore, the distance between the substrate and an evaporation source holder can be shortened in accordance with the present invention, and miniaturization of the evaporation apparatus can be achieved. The evaporation apparatus becomes smaller, and therefore the amount of sublimated evaporation materials that adhere to internal walls or protective shields in film formation chambers is reduced, and the evaporation materials can be effectively utilized.

Further, the present invention can provide a manufacturing apparatus in which a plurality of film formation chambers for performing evaporation processing are disposed in succession. Throughput of the light emitting device can be enhanced if parallel processing is performed in the plurality of film formation chambers.

In addition, the present invention can provide a manufacturing system that makes it possible to directly install containers that enclose evaporation materials, film thickness monitors, and the like in the evaporation apparatus, without exposure to the atmosphere. Handling of the evaporation materials is facilitated in accordance with the present invention, and the mixing in of impurities into the evaporation materials can be avoided. Containers sealed by a material manufacturer can be directly installed in the evaporation apparatus in accordance with this type of manufacturing system, and therefore oxygen and moisture can be prevented from adhering to the evaporation materials, and it becomes possible to handle even more very highly purified light emitting elements in the future.

What is claimed is:

1. A manufacturing method of a light emitting device, comprising the steps of:
   transporting a substrate over which an electrode is formed to a processing chamber coupled to a first transporting chamber;
   annealing the substrate in a vacuum to remove moisture and gas in the processing chamber;
   transporting the annealed substrate to a first film formation chamber coupled to a second transporting chamber via a first delivery chamber provided between the first and second transporting chambers;
   forming an organic compound layer over the electrode in the first film formation chamber by moving an evaporation source holder including a plurality of containers in each of which an evaporation material is enclosed with respect to the substrate in an x-axis direction and in a y-axis direction which is orthogonal to the x-axis direction and by rotating the evaporation source holder so that the plurality of containers switch places with each other when switching between the x-axis direction and the y-axis direction;
   transporting the substrate over which the organic compound layer is formed to a second film formation chamber coupled to a third transporting chamber via a second delivery chamber provided between the second and third transporting chambers; and
   forming a metallic film over the organic compound layer in the second film formation chamber.

2. The manufacturing method according to claim 1, wherein the annealing is performed at a temperature of 100° C. to 250° C.

3. The manufacturing method according to claim 1, wherein the annealing is performed for 30 minutes or more.

4. The manufacturing method according to claim 1, wherein an organic resin film is formed over the substrate over which the electrode is formed.

5. The manufacturing method according to claim 1, wherein the electrode is an anode.

6. The manufacturing method according to claim 1, wherein the metallic film is a cathode.

7. The manufacturing method according to claim 1, further comprising the step of:
   adjusting a moving speed of the evaporation source holder in accordance with values measured by a film thickness monitor formed in the evaporation source holder.

8. The manufacturing method according to claim 1, wherein half-rotation is repeatedly performed when rotating the evaporation source holder.

9. A manufacturing method of a light emitting device, comprising the steps of:
   transporting a substrate over which an electrode is formed to a processing chamber coupled to a first transporting chamber;
   annealing the substrate at a pressure of $5 \times 10^{-3}$ Torr or less to remove moisture and gas in the processing chamber;
   transporting the annealed substrate to a first film formation chamber coupled to a second transporting chamber via a first delivery chamber provided between the first and second transporting chambers;
   forming an organic compound layer over the electrode in the first film formation chamber by moving an evaporation source holder including a plurality of containers in each of which an evaporation material is enclosed with respect to the substrate in an x-axis direction and in a y-axis direction which is orthogonal to the x-axis direction and by rotating the evaporation source holder so that the plurality of containers switch places with each other when switching between the x-axis direction and the y-axis direction;
   transporting the substrate over which the organic compound layer is formed to a second film formation chamber coupled to a third transporting chamber via a second delivery chamber provided between the second and third transporting chambers; and
   forming a metallic film over the organic compound layer in the second film formation chamber.

10. The manufacturing method according to claim 9, wherein the annealing is performed at a temperature of 100° C. to 250° C.

11. The manufacturing method according to claim 9, wherein the annealing is performed for 30 minutes or more.

12. The manufacturing method according to claim 9, wherein an organic resin film is formed over the substrate over which the electrode is formed.

13. The manufacturing method according to claim 9, wherein the electrode is an anode.

14. The manufacturing method according to claim 9, wherein the metallic film is a cathode.

15. The manufacturing method according to claim 9, further comprising the step of:
adjusting a moving speed of the evaporation source holder in accordance with values measured by a film thickness monitor formed in the evaporation source holder.

16. The manufacturing method according to claim 9, wherein half-rotation is repeatedly performed when rotating the evaporation source holder.

17. A manufacturing method of a light emitting device, comprising the steps of:
transporting a substrate over which an electrode is formed to a processing chamber coupled to a first transporting chamber;
annealing the substrate in a vacuum to remove moisture and gas in the processing chamber;
transporting the annealed substrate to a first film formation chamber coupled to a second transporting chamber via a first delivery chamber provided between the first and second transporting chambers;
forming an organic compound layer over the electrode in the first film formation chamber by moving an evaporation source holder including a plurality of containers in each of which an evaporation material is enclosed with respect to the substrate in an x-axis direction and in a y-axis direction which is orthogonal to the x-axis direction and by rotating the evaporation source holder so that the plurality of containers switch places with each other when switching between the x-axis direction and the y-axis direction;
transporting the substrate over which the organic compound layer is formed to a second film formation chamber coupled to a third transporting chamber via a second delivery chamber provided between the second and third transporting chambers;
forming a metallic film over the organic compound layer in the second film formation chamber;
transporting the substrate over which the metallic film is formed to a sealing chamber coupled to a fourth transporting chamber via a third delivery chamber provided between the third and fourth transporting chambers; and
attaching a sealing substrate to the substrate over which the metallic film is formed, in the sealing chamber.

18. The manufacturing method according to claim 17, wherein the annealing is performed at a temperature of 100° C. to 250° C.

19. The manufacturing method according to claim 17, wherein the annealing is performed for 30 minutes or more.

20. The manufacturing method according to claim 17, wherein an organic resin film is formed over the substrate over which the electrode is formed.

21. The manufacturing method according to claim 17, wherein the electrode is an anode.

22. The manufacturing method according to claim 17, wherein the metallic film is a cathode.

23. The manufacturing method according to claim 17, further comprising the step of:
adjusting a moving speed of the evaporation source holder in accordance with values measured by a film thickness monitor formed in the evaporation source holder.

24. The manufacturing method according to claim 17, wherein half-rotation is repeatedly performed when rotating the evaporation source holder.

25. A manufacturing method of a light emitting device, comprising the steps of:
transporting a substrate over which an electrode is formed to a processing chamber coupled to a first transporting chamber;
annealing the substrate at a pressure of $5 \times 10^{-3}$ Torr or less to remove moisture and gas in the processing chamber;
transporting the annealed substrate to a first film formation chamber coupled to a second transporting chamber via a first delivery chamber provided between the first and second transporting chambers;
forming an organic compound layer over the electrode in the first film formation chamber by moving an evaporation source holder including a plurality of containers in each of which an evaporation material is enclosed with respect to the substrate in an x-axis direction and in a y-axis direction which is orthogonal to the x-axis direction and by rotating the evaporation source holder so that the plurality of containers switch places with each other when switching between the x-axis direction and the y-axis direction;
transporting the substrate over which the organic compound layer is formed to a second film formation chamber coupled to a third transporting chamber via a second delivery chamber provided between the second and third transporting chambers;
forming a metallic film over the organic compound layer in the second film formation chamber;
transporting the substrate over which the metallic film is formed to a sealing chamber coupled to a fourth transporting chamber via a third delivery chamber provided between the third and fourth transporting chambers; and
attaching a sealing substrate to the substrate over which the metallic film is formed, in the sealing chamber.

26. The manufacturing method according to claim 25, wherein the annealing is performed at a temperature of 100° C. to 250° C.

27. The manufacturing method according to claim 25, wherein the annealing is performed for 30 minutes or more.

28. The manufacturing method according to claim 25, wherein an organic resin film is formed over the substrate over which the electrode is formed.

29. The manufacturing method according to claim 25, wherein the electrode is an anode.

30. The manufacturing method according to claim 25, wherein the metallic film is a cathode.

31. The manufacturing method according to claim 25, further comprising the step of:
adjusting a moving speed of the evaporation source holder in accordance with values measured by a film thickness monitor formed in the evaporation source holder.

32. The manufacturing method according to claim 25, wherein half-rotation is repeatedly performed when rotating the evaporation source holder.

* * * * *